United States Patent
Nakahara et al.

(10) Patent No.: US 8,053,756 B2
(45) Date of Patent: Nov. 8, 2011

(54) NITRIDE SEMICONDUCTOR LIGHT EMITTING ELEMENT

(75) Inventors: Ken Nakahara, Kyoto (JP); Norikazu Ito, Kyoto (JP); Kazuaki Tsutsumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 443 days.

(21) Appl. No.: 12/227,694

(22) PCT Filed: May 26, 2006

(86) PCT No.: PCT/JP2006/310551
§ 371 (c)(1),
(2), (4) Date: Nov. 25, 2008

(87) PCT Pub. No.: WO2007/138658
PCT Pub. Date: Dec. 6, 2007

(65) Prior Publication Data
US 2009/0166607 A1 Jul. 2, 2009

(51) Int. Cl.
*H01L 29/06* (2006.01)
*H01L 31/00* (2006.01)

(52) U.S. Cl. ........ 257/13; 257/79; 257/94; 257/96; 257/103; 257/E33.008; 257/E33.013

(58) Field of Classification Search ............ 257/13, 257/E33.008
See application file for complete search history.

(56) References Cited

U.S. PATENT DOCUMENTS

| | | | |
|---|---|---|---|
| 6,060,335 A | 5/2000 | Rennie et al. | |
| 6,242,761 B1 * | 6/2001 | Fujimoto et al. | 257/94 |
| 6,309,459 B1 | 10/2001 | Yuge et al. | |
| 7,339,195 B2 * | 3/2008 | Goto et al. | 257/79 |
| 2002/0056836 A1 | 5/2002 | Sawazaki et al. | |
| 2004/0056259 A1 | 3/2004 | Goto et al. | |

FOREIGN PATENT DOCUMENTS

| | | |
|---|---|---|
| JP | 11-54794 | 6/1989 |
| JP | 2778405 B | 7/1998 |
| JP | 10-290027 | 10/1998 |
| JP | 11-307866 | 11/1999 |
| JP | 2000-286448 | 10/2000 |
| JP | 2001-077413 | 3/2001 |

(Continued)

*Primary Examiner* — Stephen W Smoot
*Assistant Examiner* — Vicki B Booker
(74) *Attorney, Agent, or Firm* — Rabin & Berdo, P.C.

(57) ABSTRACT

Provided is a nitride semiconductor light emitting element having an improved carrier injection efficiency from a p-type nitride semiconductor layer to an active layer by simple means from a viewpoint utterly different from the prior art. A buffer layer 2, an undoped GaN layer 3, an n-type GaN contact layer 4, an InGaN/GaN superlattice layer 5, an active layer 6, a first undoped InGaN layer 7, a second undoped InGaN layer 8, and a p-type Gan-based contact layer 9 are stacked on a sapphire substrate 1. A p-electrode 10 is formed on the p-type Gan-based contact layer 9. An n-electrode 11 is formed on a surface where the n-type GaN contact layer 4 is exposed as a result of mesa-etching. The first undoped InGaN layer 7 is formed to contact a well layer closest to a p-side in the active layer having a quantum well structure, and subsequently the second undoped InGaN layer 8 is formed thereon. The carrier injection efficiency into the active layer 6 can be improved by making the total film thickness of the first and second undoped InGaN layers 20 nm or less.

11 Claims, 16 Drawing Sheets

FOREIGN PATENT DOCUMENTS

| | | |
|---|---|---|
| JP | 2002-261395 | 9/2002 |
| JP | 2003-124573 | 4/2003 |
| JP | 2004-128521 | 4/2004 |
| JP | 2005-268459 | 9/2005 |
| JP | 2006-135221 | 5/2006 |

* cited by examiner

NITRIDE SEMICONDUCTOR LIGHT EMITTING ELEMENT

TECHNICAL FIELD

The present invention relates to a nitride semiconductor light emitting element including an active layer which has a quantum well structure with a well layer made of a nitride containing In.

BACKGROUND ART

Recently, short-wavelength semiconductor lasers have been intensively developed for the application of the semiconductor lasers in high density optical disk recording and the like. Hexagonal compound semiconductors including nitrogen (hereinafter, simply called nitride semiconductors) such as GaN, AlGaN, InGaN, InGaAlN and GaPN are used for short wavelength semiconductor lasers. In addition, LEDs using nitride semiconductors also have been developed.

As the nitride semiconductor light emitting elements, light emitting elements of the MIS structure have been used in some cases. However, such a light emitting element has a high-resistance i-type GaN-based semiconductor stacked thereon, and accordingly has a problem of generally very low emission output. To solve such a problem, the i-type GaN-based semiconductor layer is irradiated with electrons or is annealed.

Additionally, even for a nitride semiconductor light emitting element having a p-type GaN-based semiconductor layer formed therein, efforts are made to increase the emission output. For example, in order to improve the luminous efficiency, it is proposed, as disclosed in Patent Document 1, that the forward voltage Vf be reduced by forming an ohmic contact between a p-electrode and a p-type GaN contact layer or by making smaller the film thickness of a p-type GaN contact layer.

Moreover, in order to improve the luminous efficiency, Patent Document 1 also proposes that Mg be used as a p-type dopant to obtain the p-type characteristics of a p-type AlGaN cladding layer, or that the film thickness and the Al composition of the p-type AlGaN cladding layer be specified to improve the crystallinity.

Patent Document 1: Japanese Patent No. 2778405

DISCLOSURE OF THE INVENTION

Problems to be Solved by the Invention

However, even if the luminous efficiency is improved by the above prior art: by the improvements in the respective attributes of the ohmic contact between the p-electrode and the p-type GaN contact layer; the film thickness of the p-type GaN contact layer; the p-type dopant; and the crystallinity of the p-type AlGaN cladding layer, the effects from these improvements are limited. In addition, effective means for further increasing the luminous efficiency is not yet to be obtained.

The present invention has been created to solve the problems mentioned above. An object of the present invention is to provide a nitride semiconductor light emitting element having an improved carrier injection efficiency from a p-type nitride semiconductor layer to an active layer and an improved luminous efficiency by simple means from a viewpoint utterly different from the prior art.

Means for Solving the Problems

A nitride semiconductor light emitting element of the present invention is a nitride semiconductor light emitting element with a structure in which an active layer is sandwiched between a p-type nitride semiconductor layer and an n-type nitride semiconductor layer, the active layer having a quantum well structure with a well layer made of a nitride containing In. The summary thereof is that a first undoped InGaN layer and a second undoped InGaN layer with an In content different from that of the first undoped InGaN layer are formed between the p-type nitride semiconductor layer and the well layer of the active layer disposed at a position closest to a p-side, and that a total film thickness of the first undoped InGaN layer and the second undoped InGaN layer is 20 nm or less.

We have found means utterly different from the above prior art as means for improving the hole injection efficiency from the p-type semiconductor layer to the active layer. In other words, it has been found that the hole injection efficiency from the p-type nitride semiconductor layer to the active layer is drastically changed when two undoped InGaN layers with different In composition ratios from each other are formed between the p-type nitride semiconductor layer and the well layer of the active layer disposed at the position closest to the p-type side, and when the total film thickness of these undoped InGaN layers becomes 20 nm or less.

Moreover, another summary is that, when the second undoped InGaN layer is formed between the first undoped InGaN layer and the p-type nitride semiconductor layer, the second undoped InGaN layer is an In composition gradient layer whose In content decreases toward the p-type nitride semiconductor layer.

Moreover, other summary is that, when Mg-doped p-type $Al_xGaN$ ($0.02 \leqq x \leqq 0.15$) is formed as a part of the p-type nitride semiconductor layer, the hole carrier concentration is made to be in a range of $2 \times 10^{17}$ cm$^{-3}$ or more.

In addition to the above-described summaries, the other summary of the nitride semiconductor light emitting element of the present invention is that, when the well layer of the active layer has an In composition ratio of 10% or more and thus the emission wavelength becomes long, a total film formation time when a growth temperature exceeds 950° C. is within 30 minutes from the time of completion of the formation of the final well layer of the active layer in a growth direction to the time of completion of the formation of a p-type contact layer that is formed as a part of the p-type nitride semiconductor layer, and that is in contact with a p-electrode. In particular, InGaN is thermally unstable and thus there arises a possibility of its decomposition when the above conditions are exceeded. In the worst case, the In is dissociated and the wafer is blackened.

EFFECTS OF THE INVENTION

In the nitride semiconductor light emitting element of the present invention, two undoped InGaN layers with different In contents from each other are formed between the p-type nitride semiconductor layer and the well layer of the active layer closest to the p-type side having the quantum well structure. The total film thickness of these two undoped InGaN layers is formed to be 20 nm or less. Thereby, the injection efficiency of holes into the active layer can be greatly improved, thus improving the luminous efficiency.

Of the two undoped InGaN layers, the undoped InGaN layer closer to the p-type nitride semiconductor layer is made to be an In composition gradient layer whose In content decreases toward the p-type nitride semiconductor layer. This makes it easy to inject holes into the active layer, thus improving the luminous efficiency.

Moreover, the p-type $Al_xGaN$ ($0.02 \leqq x \leqq 0.15$) is stacked on the two undoped InGaN layers and is formed such that the hole carrier concentration due to p-type impurities becomes $2 \times 10^{17}$ cm$^{-3}$ or more. Thereby, the amount of holes injected into the active layer can be obtained sufficiently, and thus the luminous efficiency can be improved.

In addition, the total film formation time when the growth temperature is 950° C. or above is made to be within 30 minutes from the time of completion of the formation of the final well layer of the active layer in the growth direction to the time of the completion of the formation of the p-type contact layer that is formed as a part of the p-type nitride semiconductor layer, and that is in contact with the p-electrode. Thereby, in a nitride semiconductor light emitting element of a comparatively long emission wavelength, in other words, when a well layer of an active layer has an In composition ratio of 10% or more, the degradation of the active layer can be prevented, and thus a high emission intensity can be maintained.

EXPLANATION OF REFERENCE NUMERALS

Figure 1:
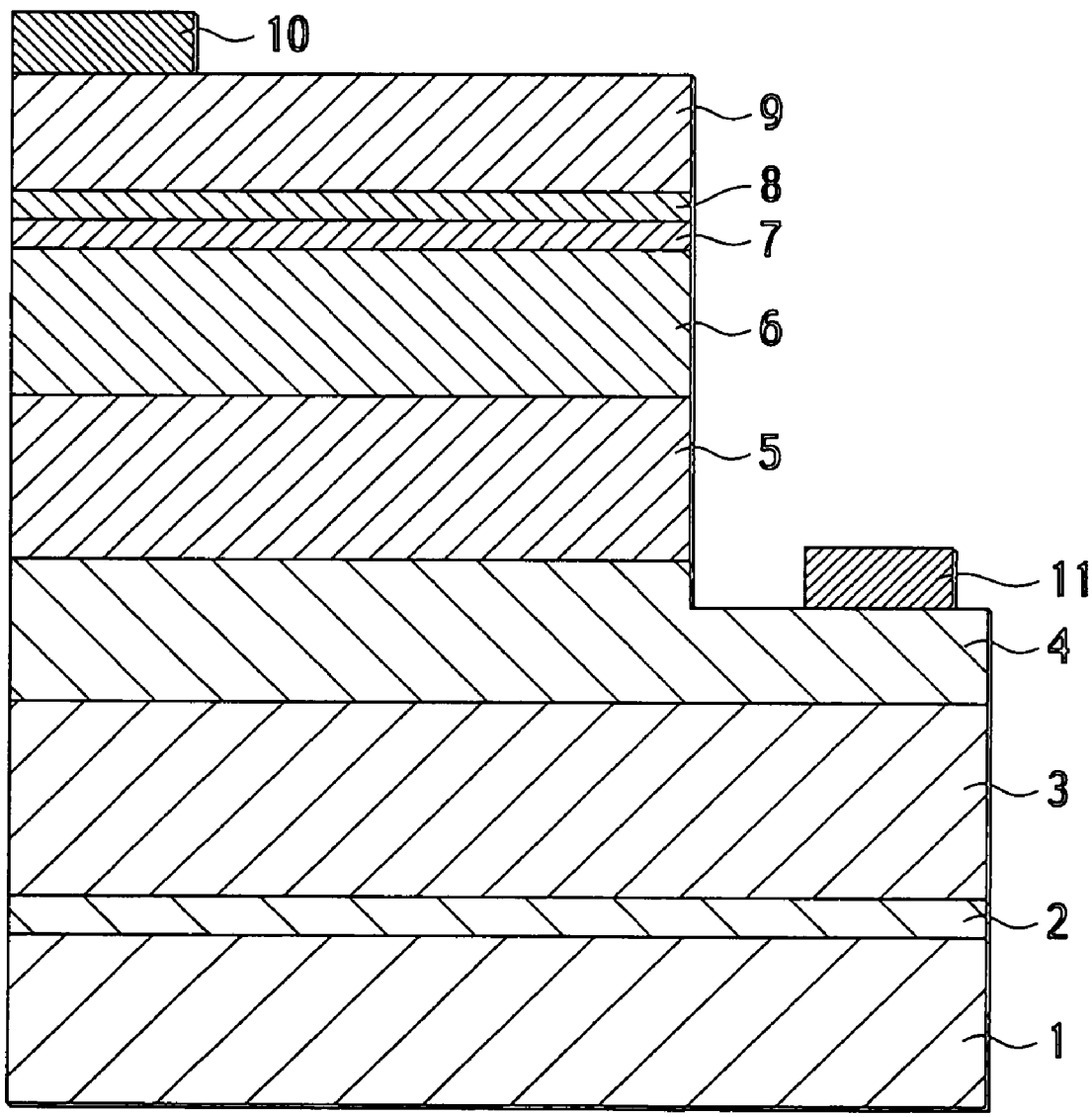
FIG. 1 is a diagram indicating a cross-sectional structure of a first nitride semiconductor light emitting element of the present invention.

1: Sapphire substrate
2: Buffer layer
3: Undoped GaN layer
4: N-type GaN contact layer
5: InGaN/GaN superlattice layer
6: Active layer
6b: Barrier layer
6c: Well layer
7: First undoped InGaN layer
8: Second undoped InGaN layer
9: P-type GaN-based contact layer
10: P-electrode
11: N-electrode
12: P-type AlGaN cladding layer

BEST MODES FOR CARRYING OUT THE INVENTION

FIG. 1 shows a cross-sectional view of one example of a first nitride semiconductor light emitting element of the present invention. On a sapphire substrate 1, stacked are a buffer layer 2, an undoped GaN layer 3, an n-type GaN contact layer 4, an InGaN/GaN superlattice layer 5, an active layer 6, a first undoped InGaN layer 7, a second undoped InGaN layer 8 and a p-type GaN-based contact layer 9. A region of the first nitride semiconductor light emitting element is partially mesa-etched from the p-type GaN-based contact layer 9, and an n-electrode 11 is formed on a surface where the n-type GaN contact layer 4 is exposed. In addition, a p-electrode 10 is formed on the p-type GaN-based contact layer 9. Here, the p-type GaN-based layer is made up of GaN having doped therein p-type impurities or a compound including GaN. The undoped InGaN layer is made up of an InGaN layer in which no impurities are intentionally doped.

As stated above, the n-type GaN contact layer 4 and the InGaN/GaN superlattice layer 5 are formed as n-type nitride semiconductor layers. The p-type GaN-based contact layer 9 is formed as a p-type nitride semiconductor layer. The nitride semiconductor light emitting element of the present invention has a double heterostructure with these n-type nitride semiconductor layers and the p-type nitride semiconductor layer sandwiching the active layer.

In the buffer layer 2, GaN, AlN, $Al_{x1}GaN$ ($0 \leqq x1 \leqq 0.1$) or the like is used. The buffer layer 2 is formed in a film thickness of from 50 to 300 Å, desirably from 100 to 200 Å. The undoped GaN layer 3 stacked on the buffer layer 2 has a film thickness of 1 to 3 μm. The n-type GaN contact layer 4 formed on the undoped GaN layer 3 has a Si doping concentration of $1 \times 10^{18}$ cm$^{-3}$ to $5 \times 10^{18}$ cm$^{-3}$ and has a film thickness of 1 to 5 μm. Additionally, the InGaN/GaN superlattice layer 5 relaxes the stress of InGaN and GaN that have a large difference in lattice constant from each other. The InGaN/GaN superlattice layer 5 causes the InGaN of the active layer 6 to grow readily. The InGaN/GaN superlattice layer 5 to be used has a constitution, for example, in which $In_xGaN$ ($0.03 \leqq x \leqq 0.1$) having a Si doping concentration of $1\times10^{18}$ cm$^{-3}$ to $5\times10^{18}$ cm$^{-3}$ and a film thickness of 10 Å and GaN having a film thickness of 20 Å are alternately stacked on each other at approximately 10 repetitions.

The active layer 6 is an active layer that has a quantum well structure (Quantum Well) and has a structure in which a well layer is sandwiched with barrier layers each having a larger band-gap than the well layer. This quantum well structure may not only be a single structure, but be a multiplexed structure. In this multiplexed case, the structure becomes a MQW (Multi-Quantum Well), namely, a multiquantum well structure. Moreover, the active layer 6 is made up of a ternary mixed crystal system of InGaN. The first undoped InGaN layer 7 is formed to contact the final well layer of the active layer 6 in a growth direction. The first undoped InGaN layer 7 has a role of a barrier layer or a cap layer of the active layer 6.

Figure 2:
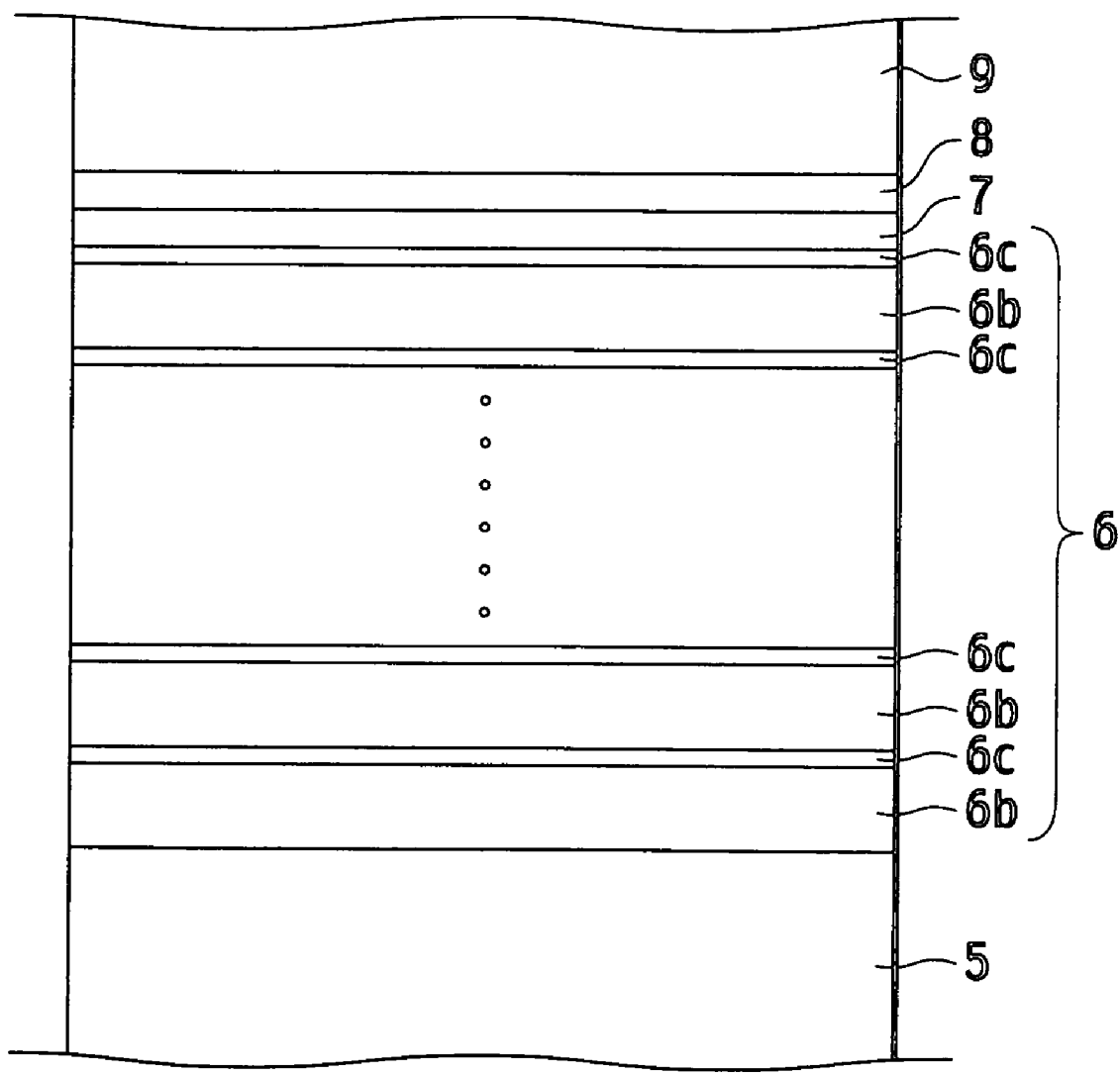
FIG. 2 is a diagram indicating a layer structure in the vicinity of an active layer.

FIG. 2 shows the structure of the active layer 6 in detail. A barrier layer 6b is disposed on a side of the InGaN/GaN superlattice layer 5 where the active layer 6 contacts the InGaN/GaN superlattice layer 5. A well layer 6c is stacked on the barrier layer 6b. This barrier layer 6b and the well layer 6c are alternately stacked on each other at a number of repetitions. Thereafter, the first undoped InGaN layer 7 is stacked on the final well layer 6c so as to be in contact with each other. The second undoped InGaN layer 8 is formed on the first undoped InGaN layer 7. The p-type Gan-based contact layer 9 is formed on the second undoped InGaN layer 8.

Here, the barrier layer 6b is made up of $In_{z1}GaN$ ($0 \leq z1 \leq 1$) either being non-doped or having an Si doping concentration of $5\times10^{16}$ cm$^{-3}$ to $5\times10^{18}$ cm$^{-3}$ and has a film thickness of 100 to 350 Å, and desirably of 150 to 300 Å. On the other hand, the well layer 6c may be made up of, for example, non-doped $In_{y1}GaN$ ($0<y1<1$, $y1>z1$) with a film thickness of 30 Å. However, when the impurities are doped therein, the Si doping concentration is desirably $5\times10^{18}$ cm$^{-3}$ or less. In addition, 3 to 8 layers, desirably 5 to 7 layers, of the well layers are formed. In the active layer 6, the emission wavelength can be changed from purple to red by allowing the above y1 to be in a range of $0<y1<1$.

In addition, the total film thickness of: the first undoped InGaN layer 7 formed to contact the final well layer of the active layer 6; and the second undoped InGaN layer 8 formed to contact the first undoped InGaN layer 7 is made to be 20 nm or less. The first undoped InGaN layer 7 has roles as an electron barrier layer that makes no electrons flow from the active layer 6 to the p-side and also as a cap layer of preventing the In of the well layer 6c from sublimating at high temperatures, the sublimating consequently causing the well layer 6c to readily break down. Hence, the first undoped InGaN layer 7 desirably has a band-gap energy equal to or more than that of the barrier layer 6b in order to have a band-gap energy larger than that of the well layer 6c and to thereby block electrons. This InGaN layer 7 is desired to be an InGaN layer with an In composition ratio of z1 or less. The second undoped InGaN layer 8 desirably has a band-gap energy larger than that of the first undoped InGaN layer 7 but smaller than that of the p-type Gan-based contact layer 9. Therefore, the In composition ratio of the second undoped InGaN layer 8 is desirably smaller than that of the first undoped InGaN layer 7 in a range excluding 0.

P-type InGaN or p-type GaN is used for the p-type Gan-based contact layer 9 formed on the second undoped InGaN layer 8. This contact layer 9 has a Mg-doping concentration of $3\times10^{19}$ cm$^{-3}$ to $3\times10^{20}$ cm$^{-3}$, and is grown to have a film thickness of approximately 200 to 3000 Å (most desirably, 700 Å to 1000 Å).

Figure 4:
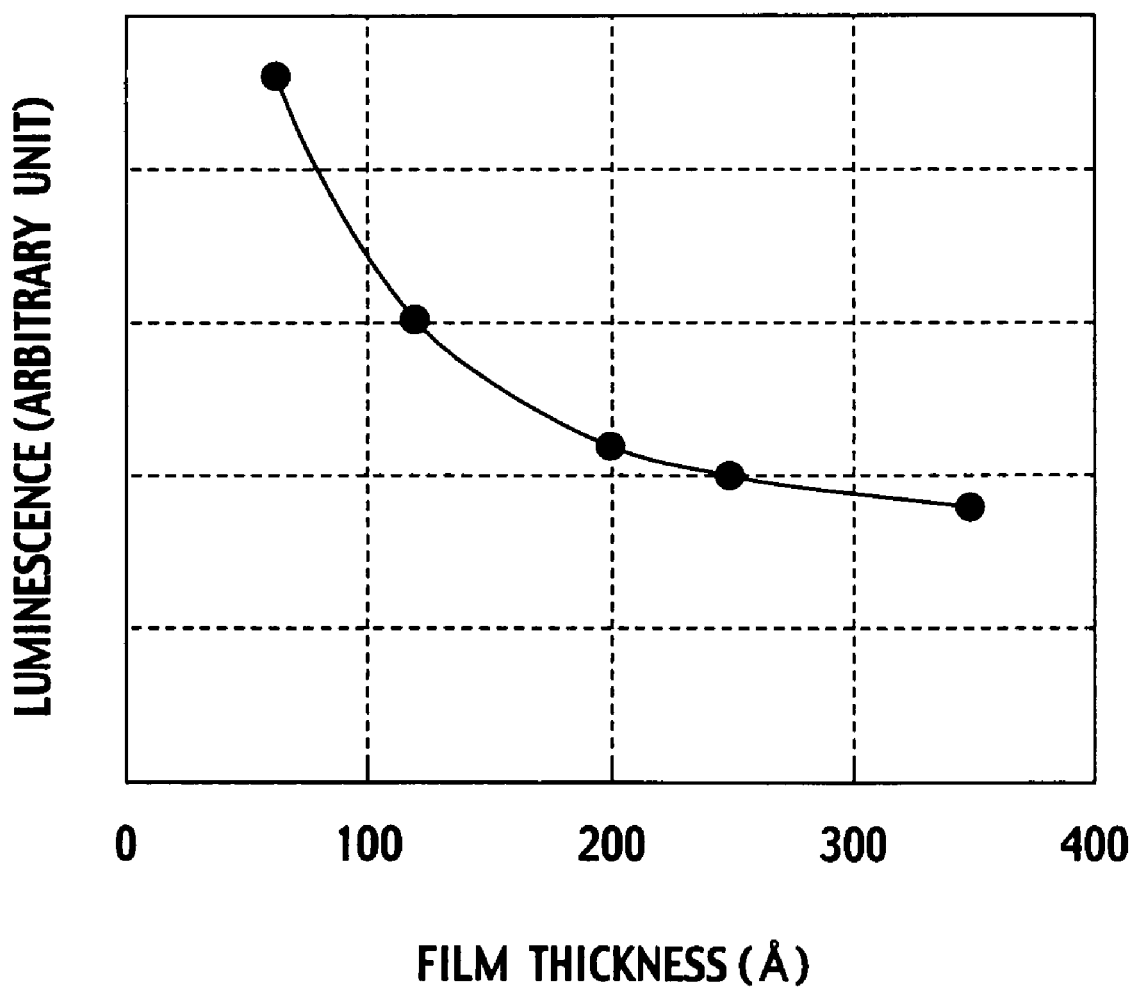
FIG. 4 is a diagram indicating the relationship between the total film thickness of undoped InGaN layers and the luminance of the nitride semiconductor light emitting element.

FIG. 4 shows a manner in which the luminance changes according to the total film thickness of the first undoped InGaN layer 7 and the second undoped InGaN layer 8. The emission intensity (luminance) was measured by changing the total film thickness of the first undoped InGaN layer 7 and the second undoped InGaN layer 8 in constitution of FIG. 1. The abscissa indicates the total film thickness of the two undoped InGaN layers. The ordinate indicates relative luminances based on the luminance at 250 Å. When the total film thickness becomes 200 Å (20 nm) or less, the luminance is shown to be greatly improved.

Figure 5:
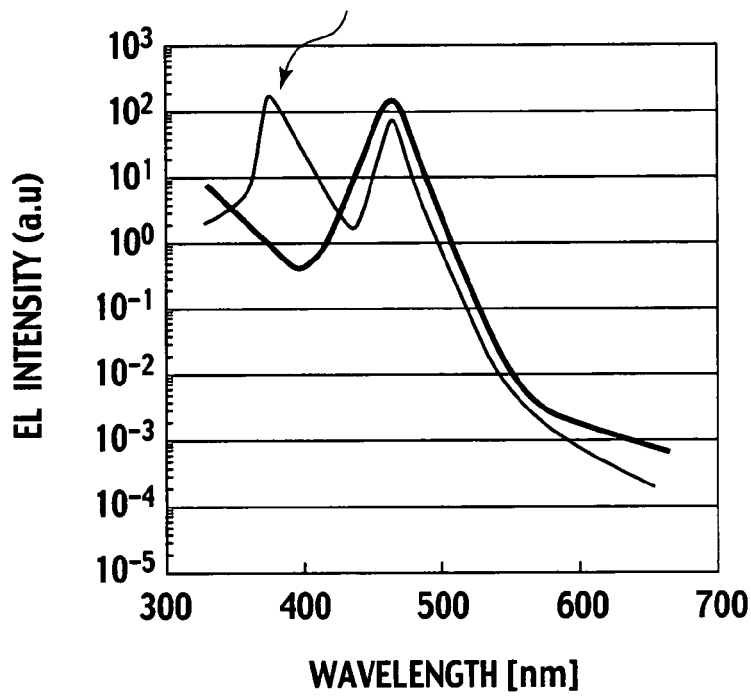
FIG. 5 is a diagram indicating an emission spectrum when the film thickness of the undoped InGaN layers is 350 Å.

This reason can be discussed as follows. FIG. 5 shows an emission spectrum when the total film thickness of the two undoped InGaN layers is 350 Å in the constitution of FIG. 1. The ordinate indicates relative luminances based on the emission intensity of a standard LED. In FIG. 5, not only an original emission spectrum of the active layer 6 but also a spectrum of the undoped InGaN layer is also shown together. The recombination of a hole and an electron is generated not only in the active layer 6 but also in the undoped InGaN layers. The luminous efficiency of the active layer 6 decreases because holes are not sufficiently transferred from the p-type Gan-based contact layer 9 to the active layer 6.

Figure 6:
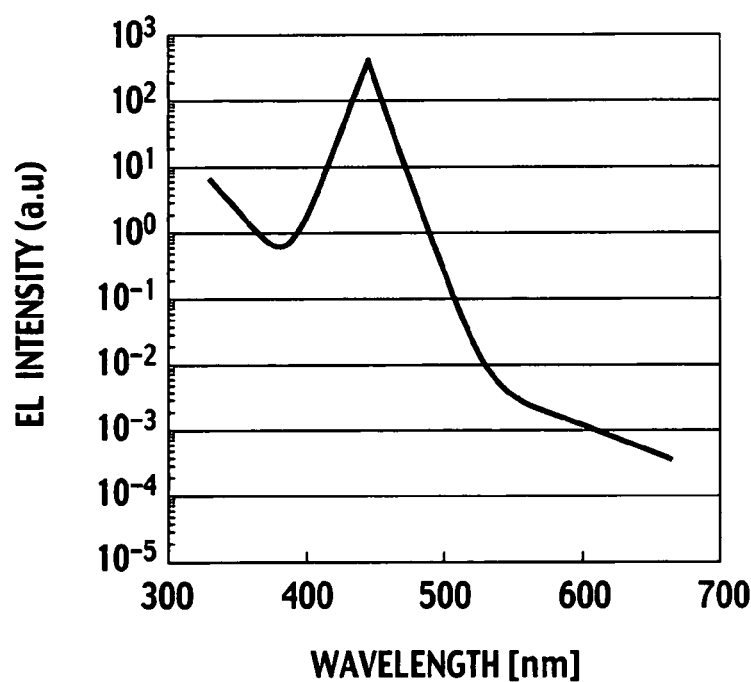
FIG. 6 is a diagram indicating an emission spectrum when the film thickness of the undoped InGaN layers is 120 Å.

On the other hand, FIG. 6 shows an emission spectrum when the total film thickness of the undoped InGaN layers is 120 Å. Only an original emission spectrum of the active layer 6 appears, but a spectrum of the undoped InGaN layer as in FIG. 5 does not appear. This is because, when the total film thickness of the undoped InGaN layers is smaller, the injection efficiency of holes from the p-type Gan-based contact layer 9 into the active layer 6 is improved. Therefore, the undoped InGaN layers with a smaller total film thickness lead to a larger emission intensity of the light emitting element. In addition, it can be recognized from FIG. 4 that the optimum value of this total film thickness is 200 Å (20 nm) or less.

Figure 3:
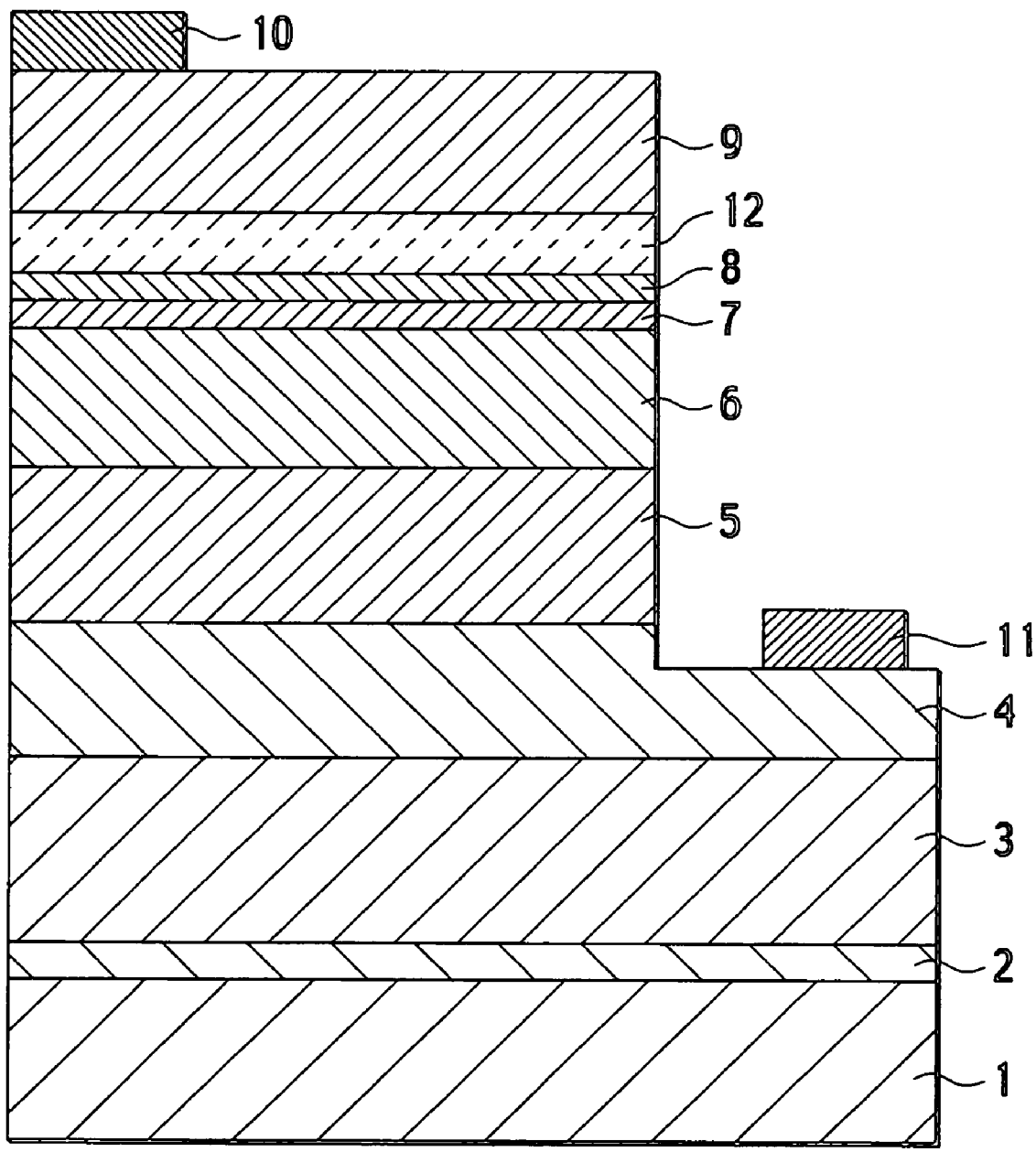
FIG. 3 is a diagram indicating a cross-sectional structure of a second nitride semiconductor light emitting element of the present invention.

Next, FIG. 3 shows a constitution of a second nitride semiconductor light emitting element of the present invention. The constituents denoted by the same symbols as those in FIG. 1 are shown to have the same constitutions as those in FIG. 1. The difference between the second nitride semiconductor light emitting element and the first nitride semiconductor light emitting element is that a p-type AlGan cladding layer 12 is inserted between the second undoped InGaN layer 8 and the p-type Gan-based contact layer 9. The p-type AlGan cladding layer 12 has a role of an electron barrier layer, and aims to further improve the injection efficiency of holes. As the p-type AlGan cladding layer 12, p-type $Al_xGaN$ ($0.02 \leq x \leq 0.15$) or the like is used. The carrier concentration of the p-type $Al_xGaN$ obtained by doping the impurity Mg therein is desirably in a range that is $2\times10^{17}$ cm$^{-3}$ or more as described below. The p-type AlGan cladding layer 12 is made up of $Al_{0.07}GaN$ with a film thickness of 150 to 300 Å (most desirably 200 Å).

In the second nitride semiconductor light emitting element (constitution of FIG. 3), the luminance was measured by changing the total film thickness of the two undoped InGaN layers. In this case also, the graphical form shown in FIG. 4 was obtained. Hence, with the constitution of FIG. 3 also, when the total film thickness of the undoped InGaN layers becomes 200 Å or less, the luminance is greatly improved.

Figure 7:
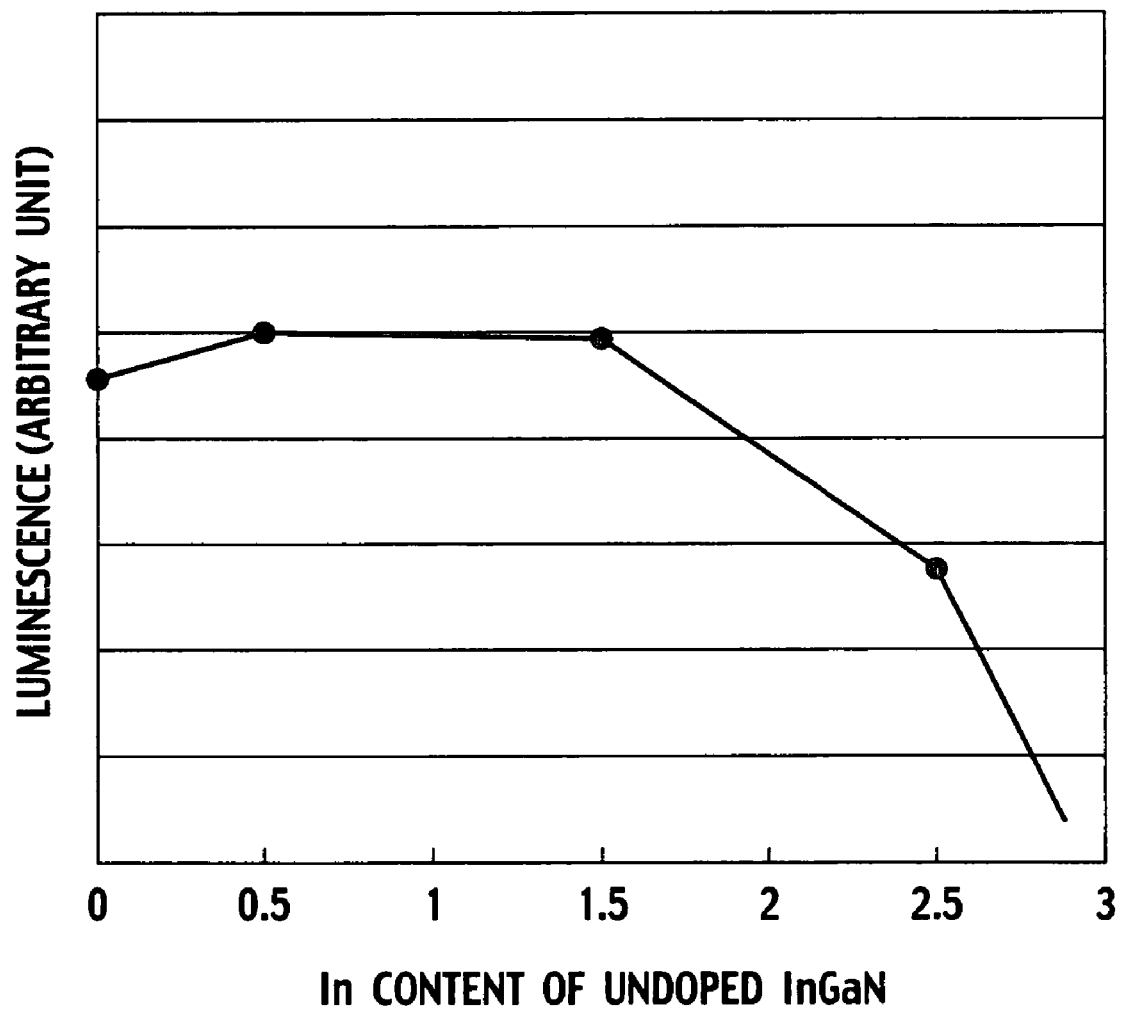
FIG. 7 is a diagram indicating the relationship between the In composition of the undoped InGaN layer and the luminance of the nitride semiconductor light emitting element.

On the other hand, FIG. 7 shows the relationship between the In composition ratio of the undoped InGaN layer and the luminance of the nitride semiconductor light emitting element. The abscissa shows the In composition ratio, and the ordinate shows the luminance (arbitrary unit). The ordinate indicates relative luminances based on the luminance measured when the In composition ratio is 0.5%. The luminances were measured in the constitutions of FIGS. 1 and 3. As can be seen from the drawing, the In composition ratio of up to approximately 2.5% can be used for light-emission luminance. Meanwhile, as the ratio becomes more than 2.5%, the light-emission luminance considerably approaches 0, and the ratio of more than 2.5% is not usable. This is because InGaN originally has a large residual electron concentration, and therefore the residual electron concentration is also increased when the In composition ratio is raised. For this reason, it is recognized that, in order to increase the amount of carriers (holes) to be injected, the In composition ratio is desired to be small. In addition, it is shown that, when the In content is approximately 0.5% to 1%, the highest luminance condition can be maintained. Therefore, in the first undoped InGaN layer 7 and the second undoped InGaN layer 8, the In composition ratio is desirably 2.5% or less, most suitably in a range of 0.5% to 1%.

Figure 8:
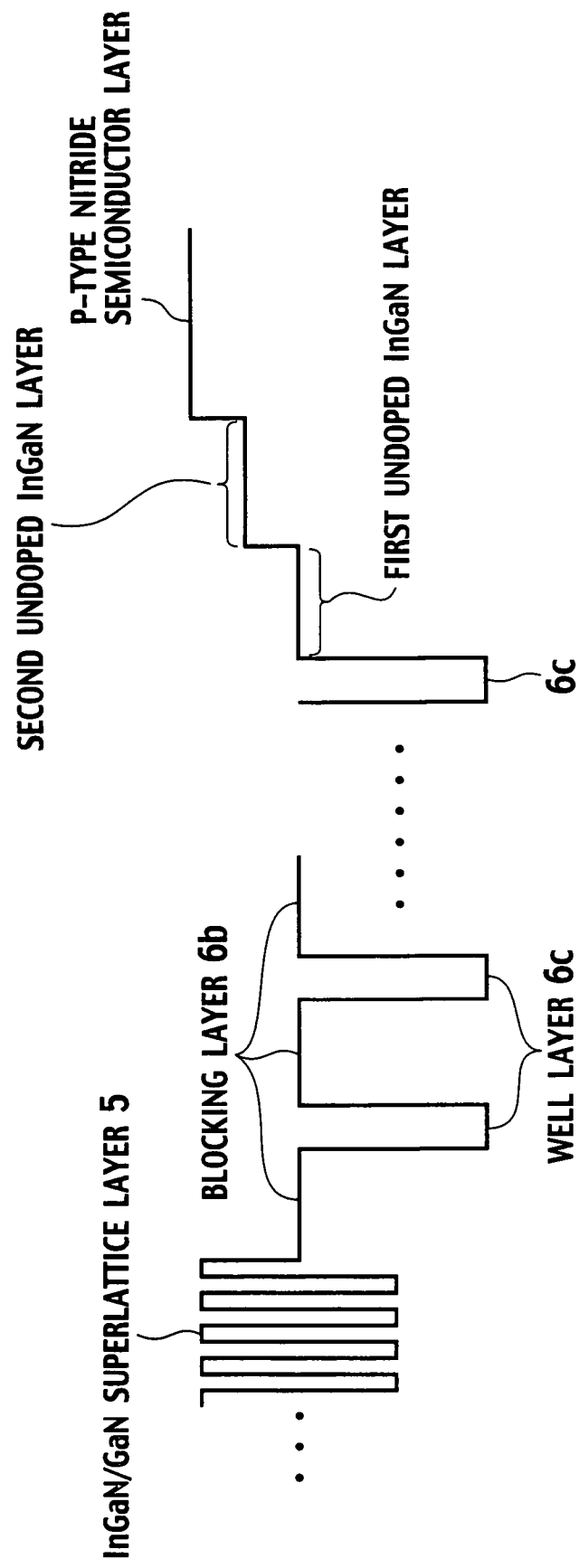
FIG. 8 is a diagram indicating a state of a band-gap energy in the vicinity of an active layer.

FIG. 8 shows one example of the constitution of the first undoped InGaN layer 7 and the second undoped InGaN layer 8, with different In compositions from each other, using a band-gap energy diagram of conduction bands. The first undoped InGaN layer 7 plays a role as an electron barrier layer. This layer is configured to have a band-gap energy equal to or more than the band-gap energy of the barrier layer 6b. In addition, the second undoped InGaN layer 8 is configured to have a band-gap energy larger than that of the first undoped InGaN layer 7 but smaller than that of the p-type Gan-based contact layer 9. Here, from the result of FIG. 7, both the first undoped InGaN layer 7 and the second undoped InGaN layer 8 are formed so as to have an In composition ratio of 2.5% or less.

As described above, when the first and second undoped InGaN layers are formed, the first and second undoped InGaN layers can be configured to have stepwise increased band-gaps in the order the first undoped InGaN layer 7, the second undoped InGaN layer 8 and the p-type nitride semiconductor layer, as shown in FIG. 8.

Figure 9:
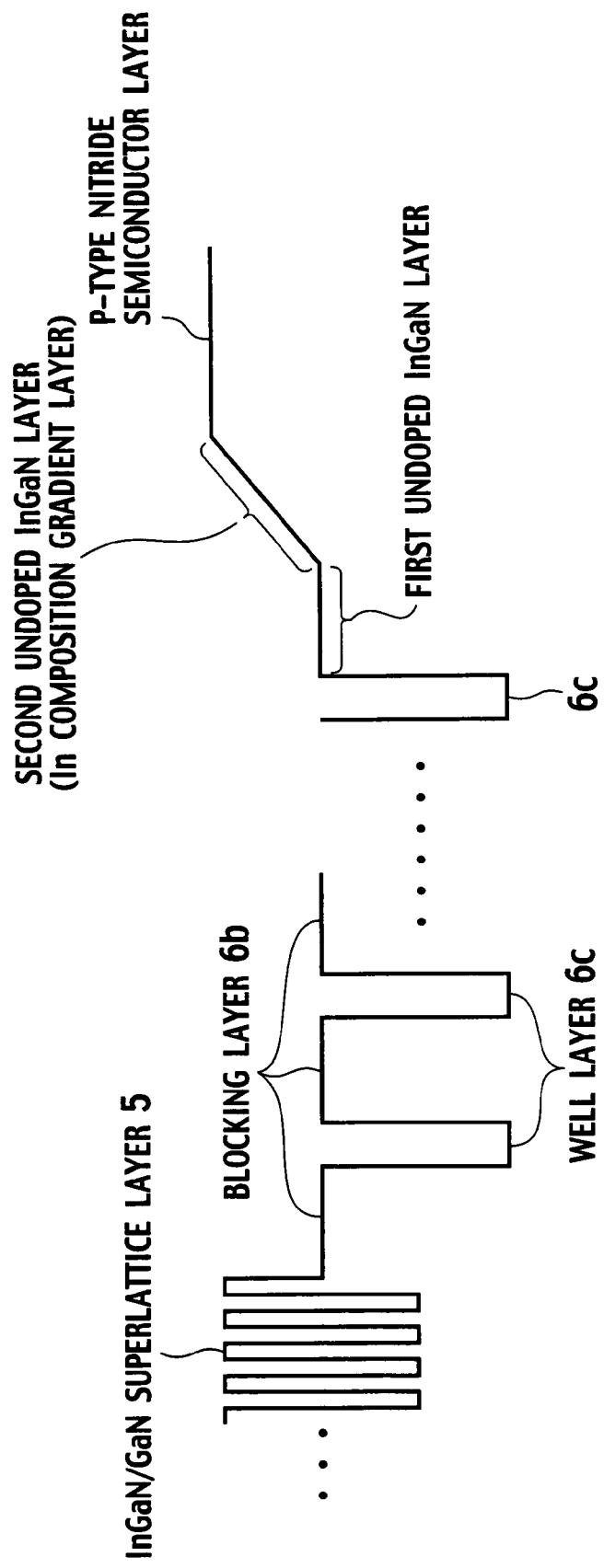
FIG. 9 is a diagram indicating a state of a band-gap energy in the vicinity of the active layer, the vicinity being different from that in FIG. 8.

Next, description will be given below of a case where the second undoped InGaN layer 8 is an In composition gradient layer. FIG. 9 shows a band-gap energy diagram of conduction bands in front and back of the active layer 6. The barrier layer 6b and the well layer 6c form a quantum well structure. The first undoped InGaN layer 7 is formed on the p-side to contact the final well layer 6c. The second undoped InGaN layer 8 is formed to contact this first undoped InGaN layer 7. The In composition ratio of this second undoped InGaN layer 8 decreases continuously from the junction with the first undoped InGaN layer 7 toward the direction of the p-type nitride semiconductor layer (rightward in the drawing). The decrease in the In composition ratio toward the p-type nitride semiconductor layer means that the band-gap energy of the second undoped InGaN layer 8 increases toward the p-type nitride semiconductor layer.

If the In composition is changed with the gradient, as shown in FIG. 9, the band structure in the conduction band that serves in hole conduction has a lower potential toward the well layer. Thus, it is desirable because holes easily flow thereinto. Moreover, because the residual electron concentration decreases when the growth temperature is high, the composition gradient of In is desirably fabricated at a high growth temperature.

Next, description will be given of methods of manufacturing the first and second nitride semiconductor light emitting elements. A PLD method (laser ablation method) is used for forming the buffer layer 2 made of single crystals such as GaN, AlN and $Al_{X1}GaN$ ($0<X1\leq0.1$) on the sapphire substrate 1.

First, the sapphire substrate 1 is placed in a load lock chamber and heated at a temperature of approximately 400° C. for 5 to 10 minutes to remove excess moisture and the like. Thereafter, the sapphire substrate 1 is transported into a vacuum chamber with an internal pressure of $1\times10^{-6}$ Torr or less and is placed so as to oppose a target. The sapphire substrate 1 is placed on a heat source, and the substrate temperature is maintained at 600° C. to 1000° C. For example, the target is irradiated with the KrF excimer laser light having an oscillation wavelength of 248 nm from a quartz window of the vacuum chamber to thereby sublimate (ablate) the material of the target. This sublimated atom adheres to the surface of the sapphire substrate 1, and the buffer layer 2 of single crystal grows up. The buffer layer 2 forms into a thickness of, for example, 100 Å to 200 Å.

A sintered GaN target is used as the target. Of course, a sintered body target of AlN, AlGaN, or InGaN may be used. However, when a sintered body target is used, it is difficult to determine a composition, since a sintered body target of InGaN is a substance into which In is hardly incorporated in general. Therefore, a sintered body target of GaN, AlN or AlGaN is desired.

Next, the sapphire substrate 1 having the buffer layer 2 formed thereon as described above is placed in a load lock chamber of an MOCVD apparatus. This substrate is heated for 5 to 10 minutes at a temperature of approximately 400° C. to remove excess moisture and the like, and then transported to a reaction chamber of the MOCVD apparatus. The substrate is subjected to thermal cleaning in the MOCVD apparatus at 1100° C. for 30 minutes in an $NH_3$ atmosphere.

Next, the undoped GaN layer 3 is stacked. The substrate temperature is increased to 1065° C. For example, undoped GaN is grown to 1 μm, and Si-doped n-type GaN is grown to 2.5 μm. The substrate temperature is lowered to 760° C., and the InGaN/GaN superlattice layer 5 is formed to, for example, 300 Å. The substrate temperature is lowered to 750° C., and the active layer 6 is formed to, for example, 3/17nm.

After the final well layer is made to grow, the first undoped InGaN layer 7 and the second undoped InGaN layer 8 are stacked thereon. The total film thickness of the first undoped InGaN layer 7 and the second undoped InGaN layer 8 is made to be 20 μm or less. The first undoped InGaN layer 7 and the second undoped InGaN layer 8 are film-formed to, for example, approximately 20 to 30 Å. When the second undoped InGaN layer 8 is not an In composition gradient layer, the In content of the first and second InGaN layers is made to be 2.5% or less, as can be recognized from FIG. 7, but most suitably from approximately 0.5% to 1%.

Next, for the constitution of FIG. 1, a p-type GaN layer is made to grow to, for example, 700 Å as the p-type Gan-based contact layer 9 by increasing the growth temperature to 1000 to 1030° C. (e.g., 1010° C.). In addition, as described below, an Mg-doped p-type InGaN layer may be used. In this case also, this layer is made to grow to, for example, 700 Å.

After a natural oxide film is removed from the surface of the p-type Gan-based contact layer 9 with hydrochloric acid, a multi-level metal film such as Ti/Au is formed as the p-electrode 10 by deposition or sputtering. Next, a mesa pattern is formed, and the GaN-based semiconductor laminated body is etched until the n-type GaN contact layer 4 is exposed therefrom. At this time, it is preferable to simultaneously form a pattern in which a pillar may stand in the mesa periphery, and to treat the surface of the n-type GaN contact layer 4 as if roughened because a large amount of light is extracted. However, in a case where the surface roughening is not executed, a sufficient etching depth is where the n-type GaN contact layer 4 is exposed. In a case where the surface roughening is executed, it is preferable to perform the etching up to a depth that is deeper by 1 μm or more than the exposure surface of the n-type GaN contact layer 4 because a large amount of light is extracted.

After completion of the mesa etching, Al is formed on the n-type GaN contact layer 4 as the n-electrode 11, and is subjected to annealing at 500° C. to 700° C. to obtain an ohmic behavior. Thus, the constitution of FIG. 1 is completed.

Incidentally, the p-electrode 10 is not formed on the p-type Gan-based contact layer 9, but the p-electrode 10 may be formed thereon after a ZnO electrode is stacked on the p-type Gan-based contact layer 9. In this case, a Ga-doped ZnO electrode is formed on the p-type Gan-based contact layer 9 by, for example, MBE (Molecular beam epitaxy) or PLD (Pulsed Laser Deposition). At this time, because the current spreading is not obtained when the specific resistance of ZnO is high, the specific resistance needs to be at least $1 \times 10^{-3}$ Ωcm or less, desirably $1 \times 10^{-4}$ Ωcm to $5 \times 10^{-4}$ Ωcm. After this, it is preferable to form convexoconcave also on the ZnO surface like on the surface of the above-mentioned n-type GaN contact layer Etching is performed till the p-type Gan-based contact layer 9 by use of wet etching with hydrochloric acid or dry etching such as RIE in order to make the ZnO electrode have predetermined dimensions. Thereafter, the entire ZnO is covered with an insulator such as SiN, SiON, $SiO_2$, $Al_2O_3$ or $ZrO_2$.

Subsequently, the mesa-etching is performed as described above, and the n-electrode 11 is formed on the n-type GaN contact layer 4. After that, a contact hole is formed by partially perforating the surface of the ZnO electrode. Ti/Au or the like is formed as the p-electrode so that the Ti/Au or the like can contact the ZnO electrode through the contact hole. At this time, Ti/Au is put also on the Al as the n-electrode simultaneously, making a metal for wire bonding. Thereafter, the entire mesa is covered with an insulator such as SiN, SiON, $SiO_2$, $Al_2O_3$ or $ZrO_2$. Permissibly, the metal portion is perforated, and the sapphire substrate 1 is reduced in thickness to then make a chip.

Next, for the constitution of FIG. 3, prior to formation of the p-type Gan-based contact layer 9, namely, after the formation of the active layer 6, the p-type AlGan cladding layer is formed to, for example, 200 Å. AlGaN may be grown at a temperature of approximately 950° C. For further improvement of crystallinity, the growth is desirably carried out at approximately 1000° C. or above. The rest of layers are formed as described above.

Next, description will be given of a method of producing an undoped InGaN layer when the second undoped InGaN layer 8 is constituted by an In composition gradient layer that has a In composition gradient as shown in FIG. 9. Generally, when an undoped InGaN layer is made to grow, trimethylindium (TMI), triethylgallium (TEG), nitrogen ($N_2$), $NH_3$, and $H_2$ are supplied to the growing room. When the In composition ratio is to be increased or decreased, the flow rate (supply ratio) of trimethylindium is generally increased or decreased at a constant temperature.

Figure 10:
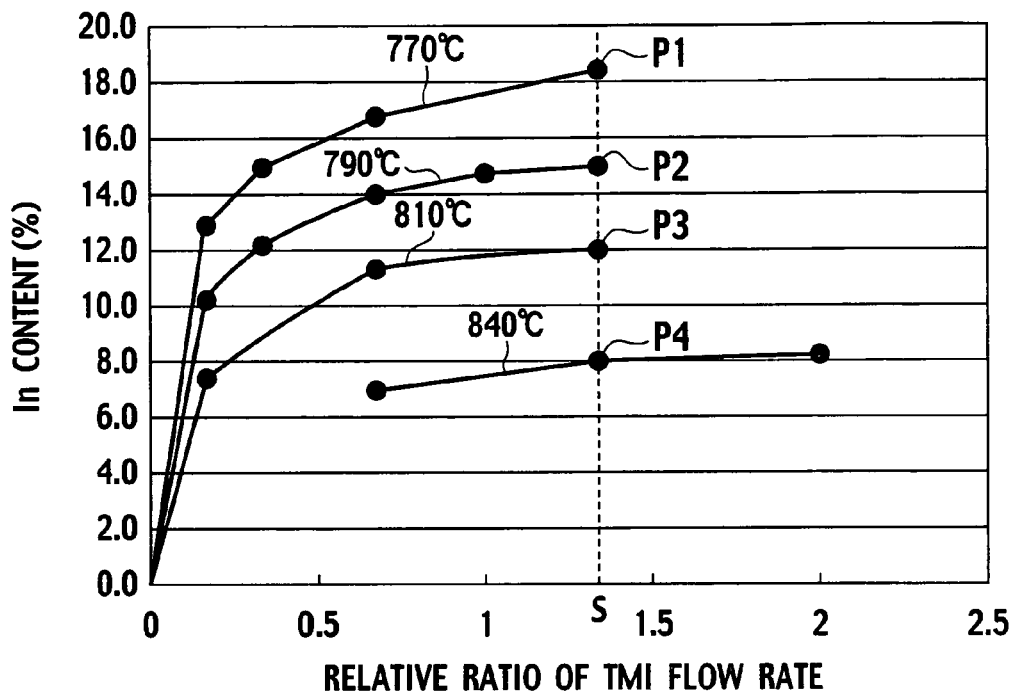
FIG. 10 is a diagram indicating the relationship between the relative ratio of In flow rate at each growth temperature and the In composition ratio of the InGaN layer.

However, when a wide range of the In composition ratio is to be covered as shown in FIG. 10, the wide range of the In composition ratio cannot be controlled only by controlling the supply ratio of trimethylindium. FIG. 10 shows the relationship between the relative ratio of the flow rate of trimethylindium and the In composition ratio when InGaN is made. The relative ratio of the flow rate of trimethylindium is a ratio between: a certain flow rate arbitrarily determined and set at 1; and each TMI flow rate. This is depicted in the graph at each specific growth temperature.

For example, when the relative ratio of the TMI flow rate becomes approximately 0.2 or less, the In content is shown to greatly change toward 0. Controlling the In composition ratio within this range becomes difficult. For this reason, utilized is the presence of the region where the In composition ratio hardly changes even if the supply ratio of trimethylindium is increased or decreased. As a result, the In composition gradient layer having a wide range of the composition ratio is easily constituted.

As is apparent from FIG. 10, at each growth temperature, even if the supply ratio of trimethylindium is increased or decreased, the In composition ratio is at its maximum point when the relative ratio of the TMI flow rate is around an S point of the drawing (approximately 1.3).

Then, the S point is taken, for example, as the value of the relative ratio of the TMI flow rate of the region where the In composition ratio hardly changes. The In composition ratios of the curves of the respective growth temperatures corresponding to the S point are set to be P1, P2, P3, and P4 with the relative ratio of the TMI flow rate being fixed at the S point. As a result, at least the In composition ratio is shown to be changed from P1 to P4, that is, from approximately 18.5% to approximately 8% when the growth temperature is changed from 770° C. to 840° C.

Figure 11:
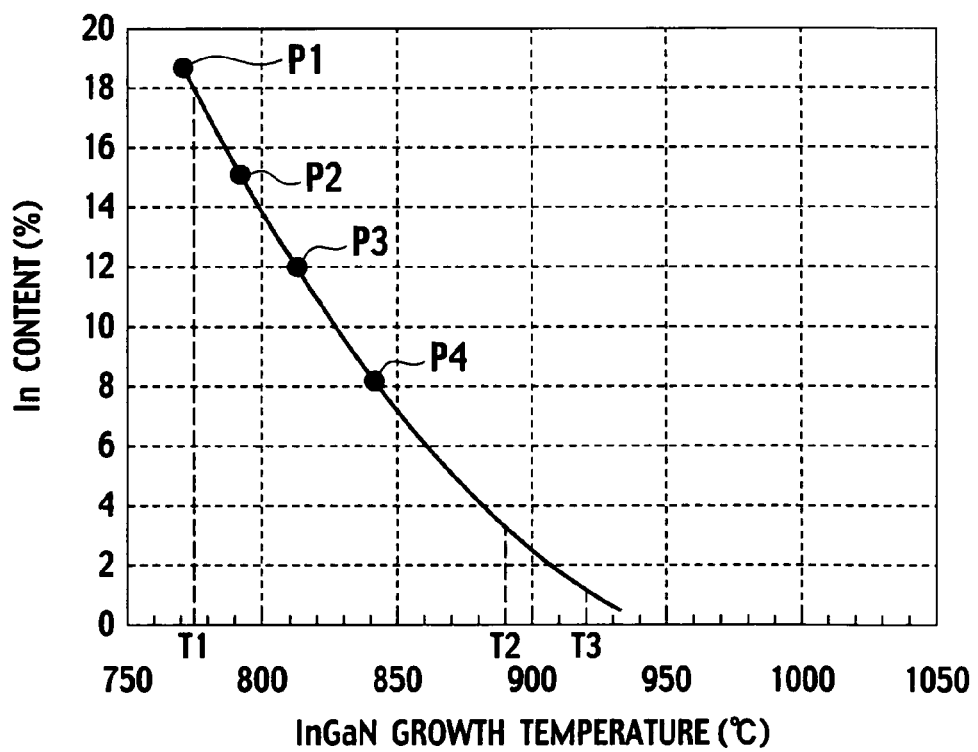
FIG. 11 is a diagram indicating the relationship between the growth temperature of the InGaN layer and the In composition ratio.

FIG. 11 shows a graph obtained by plotting the In composition ratios when the relative ratio of the TMI flow rate is fixed at the S point and when the growth temperature is changed from 770° C. to 840° C. and to a higher temperature, as in the above manner. The abscissa of FIG. 11 shows the growth temperature of the undoped InGaN, and the ordinate shows the In composition ratio of the undoped InGaN.

As described above, the wide range from larger to smaller In composition ratios can be obtained as the growth temperature is increased without changing the relative ratio of the TMI flow rate. In addition, the In composition gradient layer can be easily produced.

The final well layer of the active layer 6 is made to grow at a growth temperature of 750° C. in the constitution of FIG. 1. Thereafter, when a Mg-doped p-type InGaN layer is formed as the p-type Gan-based contact layer 9, the growth temperature should be increased to approximately 850° C. Therefore, an undoped InGaN layer that has an In composition gradient can be formed automatically in the process of increasing the temperature up to the growth temperature. Specifically, when the growth temperature is sequentially and linearly increased up to approximately 850° C., an undoped InGaN layer with a composition gradient curve as shown in FIG. 11 is formed. Moreover, in the constitution of FIG. 3, when the p-type AlGan cladding layer 12 is made to grow at a temperature of approximately 950° C., a gradient curve up to the growth temperature of approximately 950° C. can be obtained in the composition gradient curve shown in FIG. 11.

As stated above, which range of the composition gradient curve shown in FIG. 11 is used is determined by the starting point and the completion point of the growth temperature. When the change in the In composition ratio of the In composition gradient layer needs to be continuously made, for example, from 18 to 3%, the growth temperature should be changed from T1 to T2. When the change in the In composition ratio needs to be continuously made from 3% to 0.5, the growth temperature should be changed from T2 to T3. As described above, the residual concentration of electrons decreases when the growth temperature is high. Therefore, the In composition gradient layer is desirably made at a higher growth temperature. In addition, the starting point of the growth temperature should also be set high.

Figure 12:
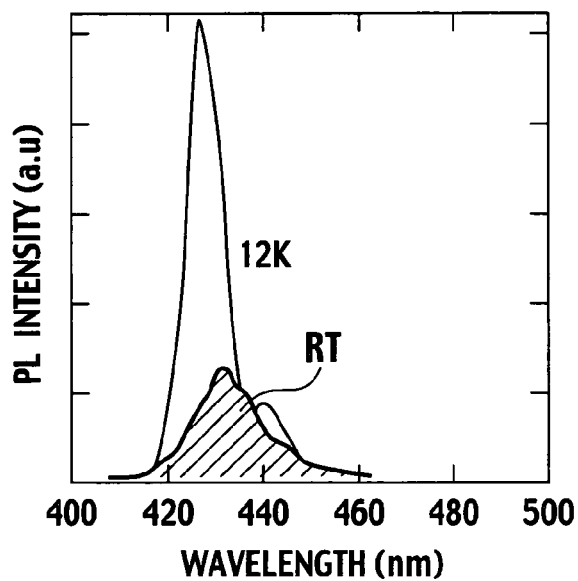
FIG. 12 is a conceptual diagram for calculating the relative integrated EL intensity.

Incidentally, luminous efficiencies were compared when three kinds of constitutions were used as semiconductor layers in contact with the final well layer of the active layer 6 in the constitution of FIG. 1 or 3. The curve X1 indicates the case where a low temperature undoped GaN layer (film thickness 400 Å) grown at a low temperature of 750 to 800° C. was used, in place of the first and second undoped InGaN layers, as a semiconductor layer between the final well layer of the active layer 6 and the p-type nitride semiconductor layer. The curve X2 indicates the case where a first undoped InGaN layer 7 and a second undoped InGaN layer 8 (total film thickness of 200 Å) that have no In composition gradient are used between the final well layer of the active layer 6 and the p-type nitride semiconductor layer. The curve X3 indicates the case where the first undoped InGaN layer 7 that has no In composition gradient and the second undoped InGaN layer 8 that has an In composition gradient (total film thickness of 200 Å) were used between the final well layer of the active layer 6 and the p-type nitride semiconductor layer. This is calculated by obtaining the relative integrated electroluminescence (EL) intensity. FIG. 12 shows an example of PL (photoluminescence), which is completely the same as the case of EL, and thus description will be given of that. First, an emission spectrum (PL intensity distribution) is measured by changing the temperature, and the integrated PL intensity distribution at each temperature is obtained.

Figure 17:
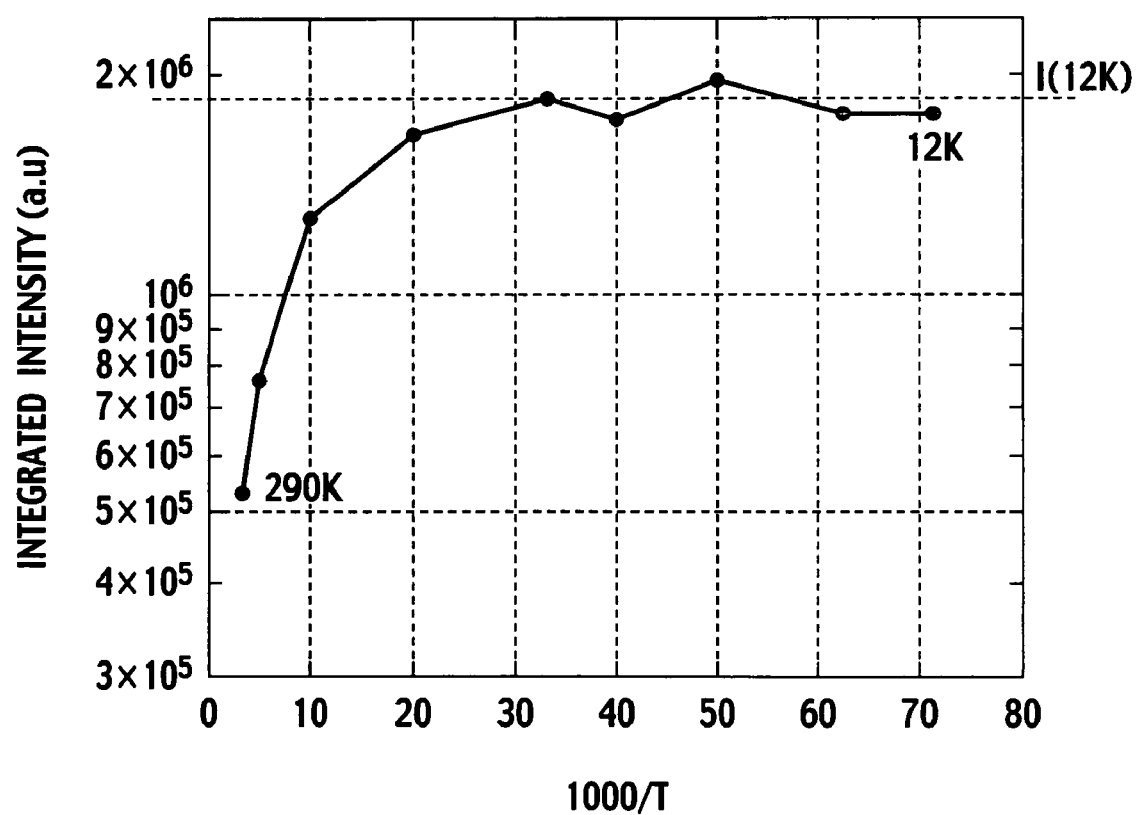
FIG. 17 is a diagram indicating a state where a value obtained by integration of PL intensity varies with temperature.

For example, the integrated PL intensity for the absolute temperature 12K (K shows Kelvin, hereinafter the same) corresponds to the area for the curve of 12K in the drawing. Next, when a predetermined absolute temperature is expressed by RT, the integrated PL intensity at the RT corresponds to the area for the curve of the RT in the drawing. A graph is made from the calculation of the integrated PL intensity at each temperature by changing the RT from 12K to 290K approximately. FIG. 17 shows one example of this graph. Generally, when the temperature rises, the luminous efficiency worsens, so that the integrated PL intensity becomes small. As shown in FIG. 17, the average of integrated PL intensities when the luminous efficiency is the highest is expressed by I (12K), and this I (12K) is the criterion.

Figure 13:
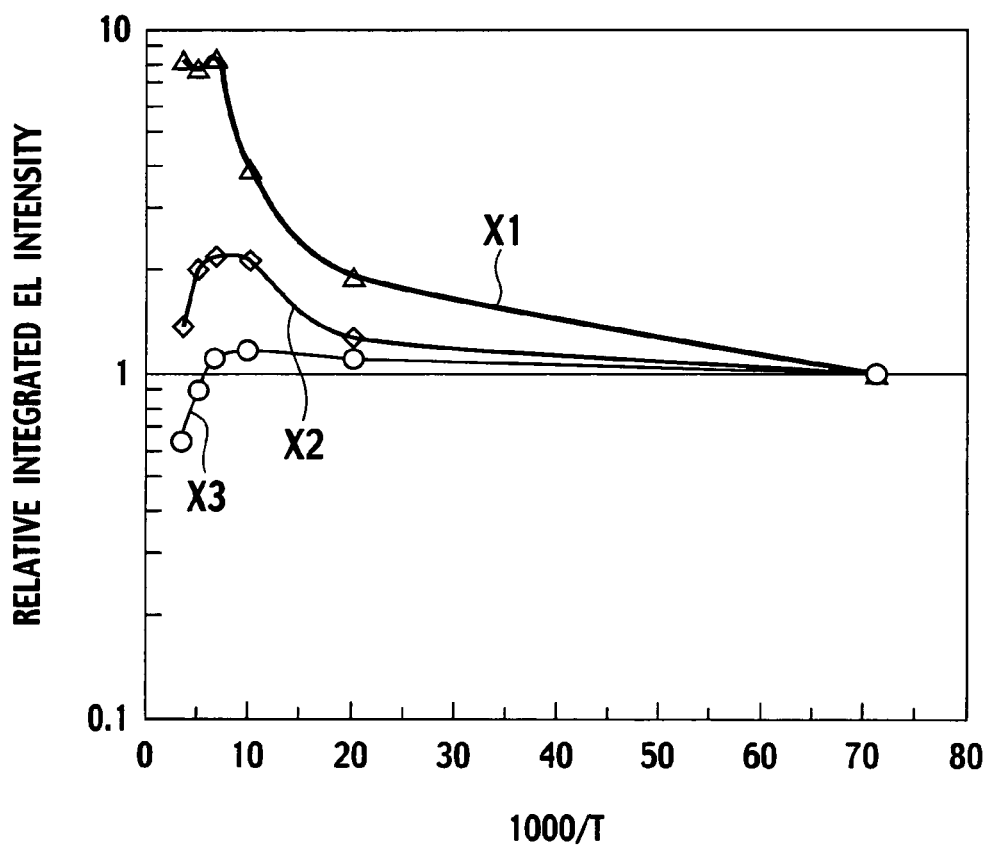
FIG. 13 is a diagram indicating a state where the relative integrated EL intensities vary due to the kind of semiconductor layers formed between a final well layer of an active layer and a p-type nitride semiconductor layer.

Next, when the integrated PL intensity at the temperature parameter RT is set to be I (RT), the relative integrated EL intensity is expressed by I (RT)/I (12K). FIG. 13 shows I (RT)/I (12K). The ordinate is the relative integrated EL intensity (relative integrated PL intensity), and the abscissa is the inverse number of the absolute temperature, resulting in Arrhenius plots. T in (1000/T) described in the abscissa is the absolute temperature, and its unit is K (Kelvin). The measurement and calculation as described above were executed, and the graphs of X1 to X3 were obtained. Note that the In composition ratios of the undoped InGaN layers which have no In composition gradient, and which were used in the measurements of X2 and X3, were all made to be 2.5% or less.

In FIG. 13, approaching of the plot to 0 in the abscissa corresponds to the direction in which the temperature increases. Therefore, even when the plot approaches 0 in the abscissa, if the value of the relative integrated EL intensity is closer to 0, a higher luminous efficiency is obtained. The higher luminous efficiency means that the higher hole injection efficiency from a p-type nitride semiconductor layer of a p-type Gan-based contact layer or a p-type AlGan cladding layer. In consideration of the constitution of the nitride semiconductor elements, compared difference is only the semiconductor layer between the final well layer of the active layer 6 and the p-type nitride semiconductor layer. Therefore, which semiconductor layer is shown to increase the hole injection efficiency the most.

As can be seen from FIG. 13, when the first undoped InGaN layer that has no In composition gradient and the second undoped InGaN layer that has the In composition gradient (curve X3) are used, the largest hole injection efficiency is increased the most.

Figure 14:
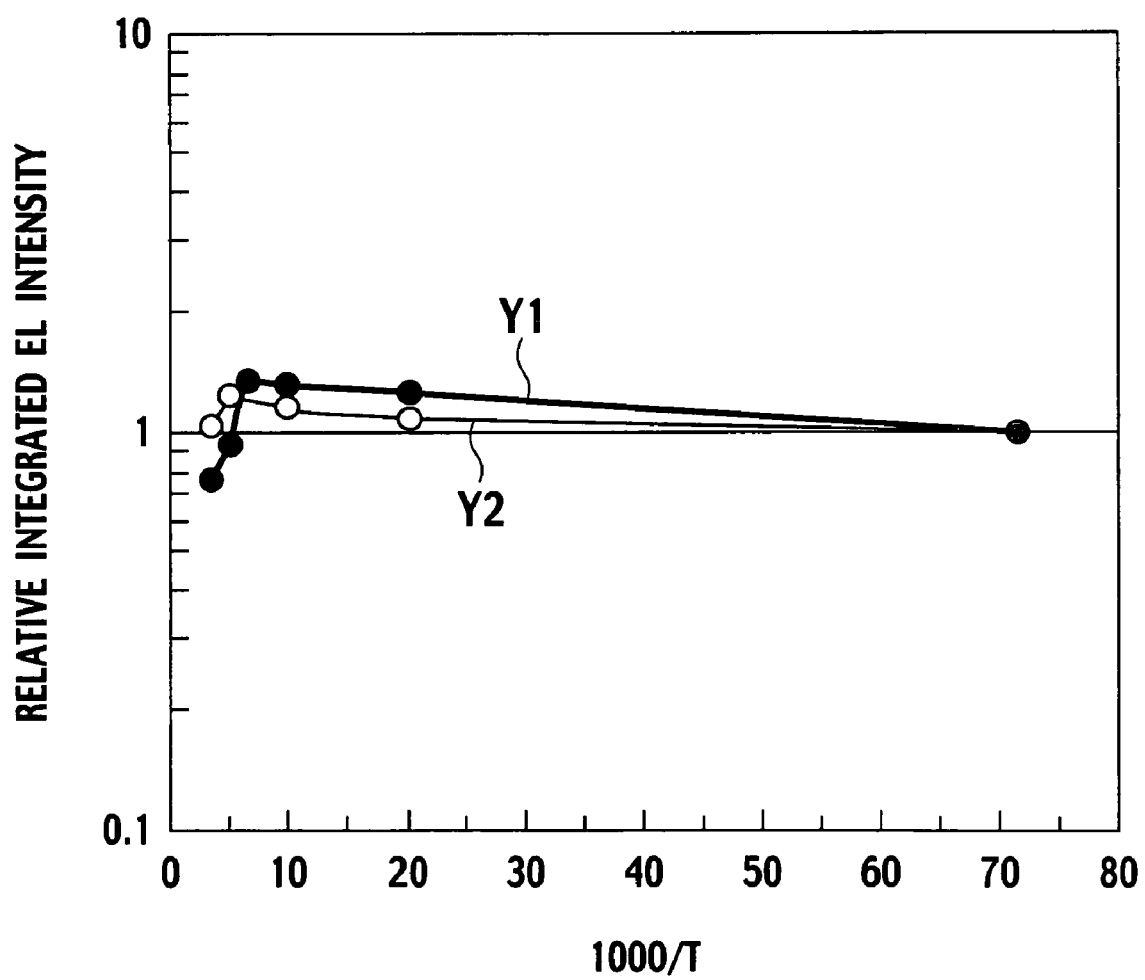
FIG. 14 is a diagram indicating a state where the relative integrated EL intensities vary due to the semiconductor layers formed between the final well layer of the active layer and the p-type nitride semiconductor layer.

On the other hand, the curve Y2 in FIG. 14 exhibits a curve of a relative integrated EL intensity where the same constitution used in the measurement of the curve X3 in FIG. 13 is adopted in the semiconductor layer between the final well layer of the active layer 6 and the p-type nitride semiconductor layer. The total film thickness of the first undoped InGaN layer that has no In composition gradient and the second undoped InGaN layer that has the In composition gradient is made 100 Å that is far smaller than the total film thickness of 20 nm or less. Moreover, the curve Y1 exhibits a curve of a relative integrated EL intensity where the barrier layer 6b is used instead of the first undoped InGaN layer, and where an undoped InGaN layer that has an In composition gradient is used as the second undoped InGaN layer. The total film thicknesses of the barrier layer and undoped InGaN layer is made 100 Å. Note that, in the measurement of Y2, the In composition ratio of the undoped InGaN layer that has no In composition gradient was made to be 2.5% or less. In addition, similar undoped InGaN layers were used for the composition gradient curves of the undoped InGaN layers having the In composition gradient, which were used in the measurements of Y1 and Y2.

As in FIG. 13, a graph is drawn by taking the ordinate as the relative integrated EL intensity and the abscissa as 1000/T. Comparison of the curve Y1 with the curve Y2 shows that Y2 is higher in hole injection efficiency in almost the entire temperature range. Additionally, in a high-temperature region, the curve Y2 is shown to have its value of relative integrated EL intensity further converged to 1. This is because the film thickness of the undoped InGaN layer 7 is decreased. It is shown that, when the total film thickness of the intermediate semiconductor layers is made 200 Å or less and as the total film thickness is made smaller, the hole injection efficiency is increased, thus improving the luminous efficiency.

Figure 15:
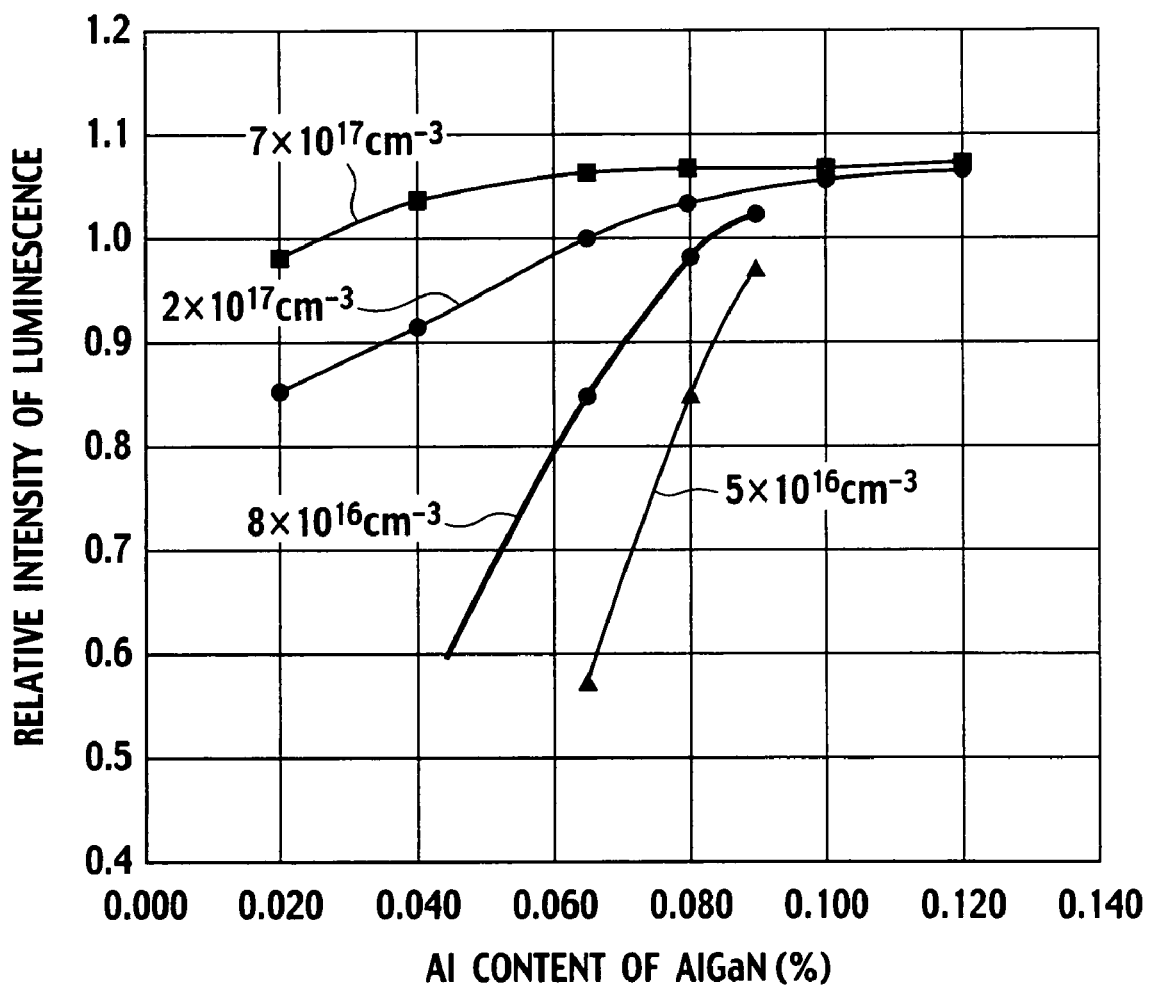
FIG. 15 is a diagram indicating the relationship between the Al composition ratio of AlGaN and the luminance of the nitride semiconductor light emitting element.

Next, FIG. 15 shows the relation among the Al content, the hole carrier concentration, and the emission intensity of the nitride semiconductor light emitting element, when the p-type AlGan cladding layer 12 is formed as in the constitution of FIG. 2. The abscissa shows the Al composition ratio of p-type AlGaN, and the ordinate shows the emission intensity. Graphs of various hole carrier concentrations are drawn. When the carrier concentration becomes less than $2\times10^{17}$ $cm^{-3}$ like the curve with a carrier concentration of $8\times10^{16}$ $cm^{-3}$ and the curve with a carrier concentration of $5\times10^{16}$ $cm^{-3}$, the inclination of the curve becomes extraordinarily steeper. The emission intensity extraordinarily falls as the Al composition ratio becomes small.

Generally, when the Al content of p-type AlGaN is enlarged, the band-gap is increased and the height of the barrier is readily secured. However, as the band-gap increases, the activation yield of impurities becomes small, and the carrier concentration falls even for the same impurity concentration. Because the improvement of the carrier concentration determines the true barrier height for electrons, the range to be used properly is determined. Its use range is $0.02 \leq x \leq 0.15$ for $Al_xGaN$. When the one practically used without extraordinarily lowering the emission intensity in this range is searched, it is revealed that the carrier concentration must be at least $2\times10^{17}$ $cm^{-3}$.

Incidentally, the above p-type AlGaN cladding layer can be formed and grown even at a substrate temperature of 950° C. However, in the case of the p-type AlGaN, the growth temperature of 1000° C. or above is desirable as described above by improving crystallinity to thereby prevent the generation of carrier compensation effect and an increase in residual electron concentration and to maintain the hole concentration (carrier concentration) high.

Figure 16:
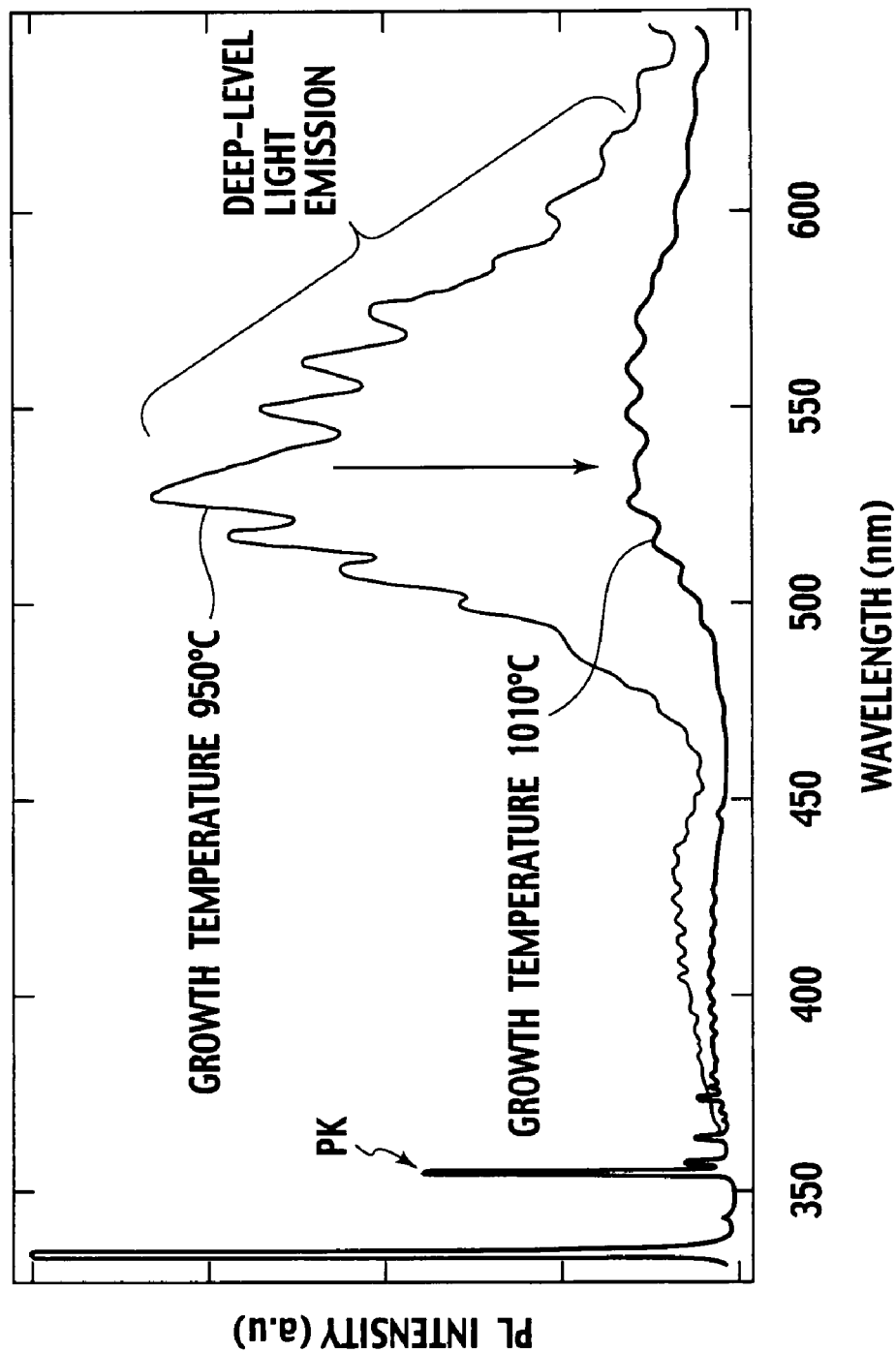
FIG. 16 is a diagram indicating the relationship between the growth temperature of AlGaN and the emission spectrum.

FIG. 16 shows how crystallinity changes according to the growth temperature. The ordinate shows the photoluminescence intensity (arbitrary unit), and the abscissa shows the emission wavelength. The ordinate relatively represents the measured photoluminescence intensity (PL intensity) on the basis on the highest point among the measured photoluminescence intensities. This is configured by stacking undoped GaN on a sapphire substrate, and then stacking 2000 Å of an AlGaN single film on the undoped GaN. The measurement was performed using a He-Cd laser as an excitation light source, an excitation intensity of 2.5 mW and a measurement temperature of 12K. Here, K is Kelvin that shows the absolute temperature.

The p-type AlGaN may be grown at a substrate temperature of 950° C. However, when it is grown at the substrate temperature of 950° C. as shown in FIG. 16, a phenomenon called deep-level light emission is generated. This shows that a carrier compensation effect is generated in the AlGaN, or that a new level, that is, a crystal defect is generated within the band-gap. This causes a decrease in the hole concentration. On the other hand, when the p-type AlGaN is grown at a substrate temperature of 1010° C. and the crystallinity is further improved, a deep-level light emission is not generated. Thus, the hole concentration is maintained as it is, which can prevent the deterioration of the hole injection efficiency. Therefore, a growth temperature of 1000° C. or above is shown to be desirable in order to further improve the crystallinity of the p-type AlGaN.

As described in FIG. 16, a growth temperature of 1000° C. or above is rather better to greatly improve the crystallinity of p-type AlGaN. However, in general, when a p-type layer such as p-type GaN or p-type AlGaN, excluding InGaN, is to be fabricated by the MOCVD method, its growth temperature is desirably a high temperature of at least 950° C. It should be noted, however, that when $Al_XGa_YN$ (here, X+Y=1, $0≦x≦1$, and $0≦Y≦1$) used for a p-type current injection layer is grown at a high temperature of 950° C. or above, a crystal that exhibits an excellent p-type conduction is obtained. Meanwhile, when the $Al_XGa_YN$ is produced at a temperature lower than 950° C., crystal imperfection is greatly increased. Therefore, the hole concentration is not improved because of the carrier compensation effect and the increase of the residual electron concentration, and thus a crystal that exhibits an excellent p-type conduction is not obtained.

Incidentally, the In content of the InGaN well layer 6c in the active layer 6 becomes as large as 10% or more in a visible light LED that emits light at a peak wavelength of 410 nm or more and that uses an especially important nitride in the industry in particular. However, as the In composition ratio becomes high, the In sublimates and the well layer 6c readily breaks down when the layer is placed at a high temperature, extraordinarily decreasing the luminous efficiency. Therefore, the crystallinity of a p-type $Al_XGa_YN$ layer is improved when the p-type $Al_XGa_YN$ is made to grow at a high temperature that exceeds 950° C. However, this causes a problem in that the In component in the already film-formed active layer having a high In composition ratio decomposes, decreasing the luminous efficiency greatly.

Figure 19:
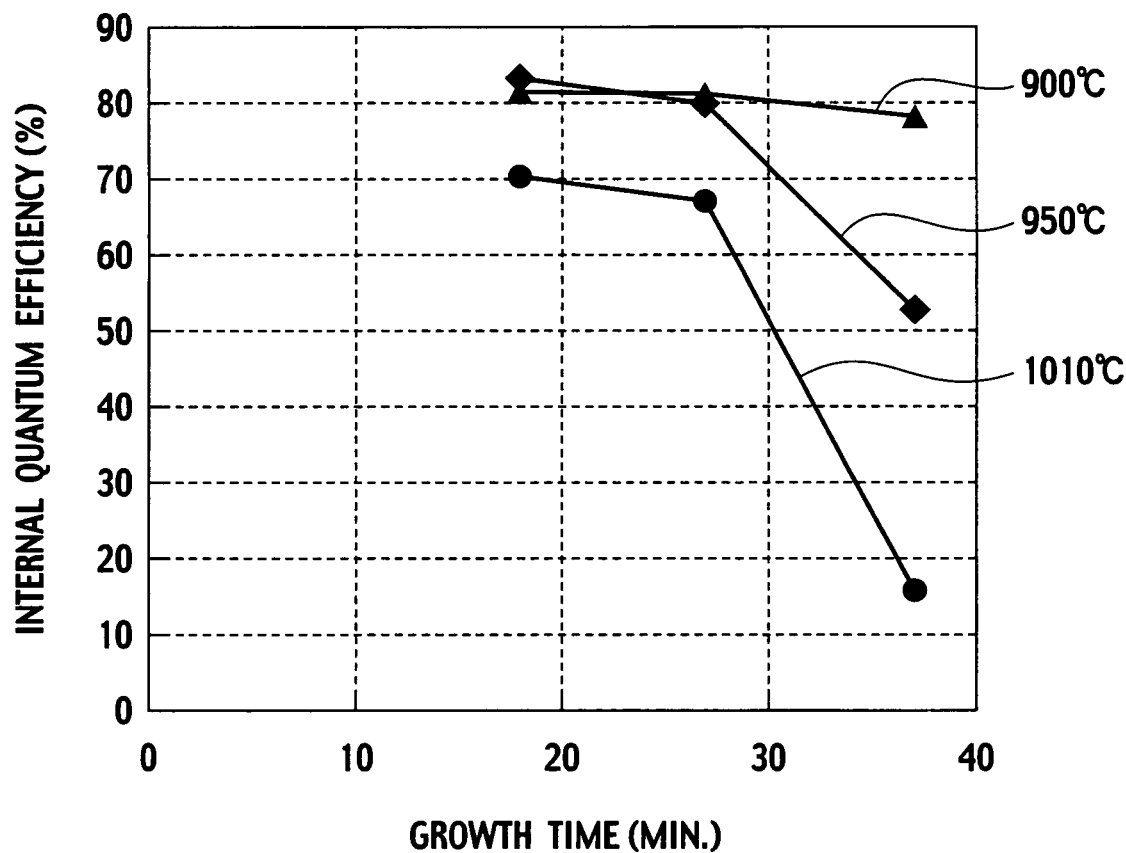
FIG. 19 is a diagram indicating the relationship between the growth time and the internal quantum efficiency at each growth temperature of the p-type nitride semiconductor layer.

FIG. 19 shows this state. The constitution of FIG. 1 or 3 described above was used as a nitride semiconductor light emitting element, and the range of the In composition ratio of the active layer 6 was changed as follows. As one example of the constitution of the active layer 6 when the In content in the InGaN well layer 6c was 10% or more, namely, the light emitting element had a peak wavelength of 410 nm or more, a barrier layer 6b was made up of $In_{z2}GaN$ ($0≦z2≦0.03$) having an Si-doping concentration of $5×10^{16}$ cm$^{-3}$ to $5×10^{18}$ cm$^{-3}$ and has a film thickness of 100 to 350 Å, desirably, 150 to 300 Å. On the other hand, the well layer 6c is made up of, for example, non-doped $In_{y2}GaN$ ($0.15≦y2≦0.18$) with a film thickness of 30 Å. Note that, when impurities are doped into the well layer 6c, the Si doping concentration is desirably $5×10^{18}$ cm$^{-3}$ or less. In addition, 3 to 8 layers, desirably 5 to 7 layers, of the well layers are formed.

FIG. 17 shows how the luminous efficiency of the nitride semiconductor light emitting element changes according to the growth temperature of the p-type GaN-based contact layer or the p-type AlGaN cladding layer. For example, a light emitting element was formed such that the p-type GaN contact layer was a p-type GaN-based contact layer in the constitution of FIG. 1, that its growth temperature was kept constant, and that the growth time of the p-type GaN contact layer was 27 minutes. Thereafter, the internal quantum efficiency was measured. In addition, the internal quantum efficiency at each growth temperature was measured by changing the growth temperature of the p-type GaN contact layer. The growth temperature was set at 880° C. in a first measurement, at 950° C. in a second measurement, at 1010° C. in a third measurement and at 1060° C. in a fourth measurement. In FIG. 17, the abscissa shows the growth temperature of the p-type GaN contact layer, and the ordinate shows the internal quantum efficiency (%) of the light emitting element.

Incidentally, the internal quantum efficiency is obtained as follows. As shown in FIG. 12, the integrated PL (photoluminescence) intensity (area of the curve 12K in the drawing) at an absolute temperature of 12K (K shows Kelvin) is represented by J (12K). Next, the PL intensity distribution curve at an absolute temperature of 290K is integrated, and the integrated PL intensity (area of the curve RT=290K in FIG. 12) is obtained. This integrated PL intensity is set to be I (290K). In this manner, the integrated PL intensities at sample temperatures of several points from 12K to 290K are obtained and plotted to draw graphs as shown in FIG. 13. The abscissa of FIG. 17 is the inverse number of the absolute temperature, resulting in an Arrhenius plot.

The average of integrated PL intensities when the luminous efficiency is the highest is expressed by I (12K), and this I (12K) is the criterion. The internal quantum efficiency is expressed as η=I (290K)/I (12K). Therefore, the luminous efficiency is higher and the emission intensity is also larger, when the internal quantum efficiency is higher.

Figure 18:
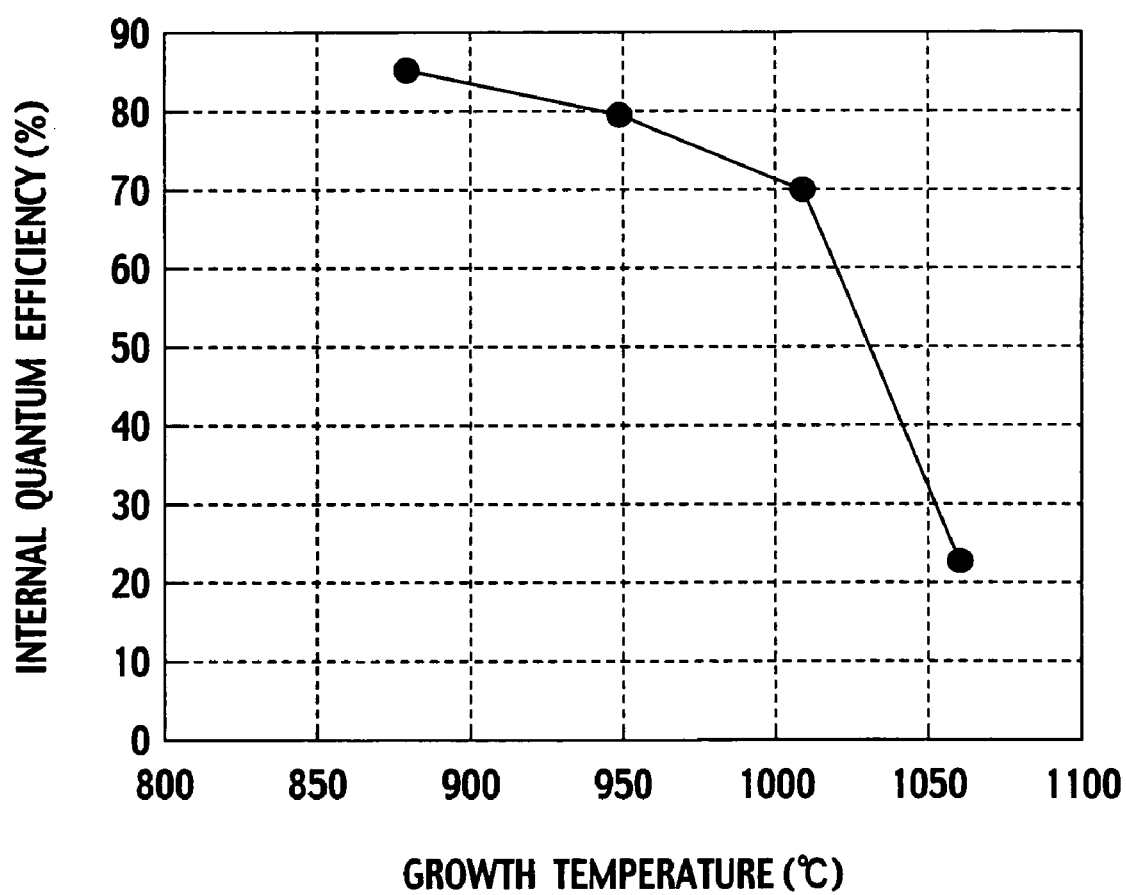
FIG. 18 is a diagram indicating the relationship between the growth temperature and the internal quantum efficiency of the p-type nitride semiconductor layer.

As is apparent from FIG. 18 shown on the basis of the internal quantum efficiency obtained as described above, the luminous efficiency worsens at an accelerated pace from approximately 1010° C. and over. From FIG. 18, the growth temperature, at which the InGaN well layer 6c of the active layer 6 is not deteriorated while the p-type GaN layer and the p-type AlGaN layer are kept to have good crystallinity, is desirably between 950° C. and 1010° C.

In FIG. 18, because the growth time was fixed at 27 minutes, the relationship between the growth temperature and the growth time was not known. For this reason, the following attributes were also measured. For example, the p-type GaN contact layer 8 was made to be a p-type GaN-based contact layer 8 in the constitution of FIG. 1. As stated above, the In content of the well layer 6c in the nitride semiconductor light emitting element was made to be 10% or more. Then, the relationship between the internal quantum efficiency and the growth time from completion of the formation of the well layer closest to the p-side among the well layers in the active layer 6 until completion of the formation of the p-type GaN contact layer was determined. The results are shown in FIG. 19. The abscissa shows the above growth time, and the ordinate shows the internal quantum efficiency. The growth temperature from the completion of the formation of the well layer closest to the p-side until the completion of the formation of the p-type GaN contact layer was changed to 900° C. at a first time, to 950° C. at a second time and to 1010° C. at a third time, and the measurement was carried out at each growth temperature.

Here, the growth time from the completion of the formation of the well layer closest to the p-side until the completion of the formation of the p-type GaN contact layer refers to the total of the growth times of the first undoped InGaN layer 7, the second undoped InGaN layer 8 and the p-type GaN contact layer, in the constitution of FIG. 1. On the other hand, in the constitution of FIG. 3, the growth time refers to the total of the growth times of the first undoped InGaN layer 7, the second undoped InGaN layer 8, the p-type AlGaN cladding layer 12 and the p-type GaN contact layer.

Of the three measurement points shown in FIG. 19, the intermediate measurement point indicates a growth time of 27 minutes. As shown in the drawing, when the growth temperature is 900° C., the effect on the emission intensity is negligible even if the growth time is long. When the growth temperature becomes 950° C. or above and the growth time is long, the emission intensity is shown to be extraordinarily decreased. This is because, when the time during which the InGaN well layer 6c of the active layer 6 is heated at a high temperature becomes long, the layer is deteriorated due to the sublimation of In, and the like. In other words, it is understood that, when a semiconductor layer is grown at a growth temperature of 950° C. or above from the completion of the formation of the well layer closest to the p-side in the active layer, 30 minutes is a limit of the total growth time.

In addition, in the nitride semiconductor light emitting element of the constitution of FIG. 3, the p-type AlGaN cladding layer is added to the constitution of FIG. 1. Therefore, in addition to the growth time of the p-type AlGaN cladding layer, the total time when the growth temperature is 950° C. or above must be within 30 minutes.

A method of manufacturing the nitride semiconductor light emitting elements of FIGS. 1 and 3 when the In content of the InGaN well layer 6c in the active layer 6 is 10% or more, that is, the peak wavelength is 410 nm or more will be described. This method is basically similar to the above-described method. Incidentally, in the constitution of FIG. 1, the layer of interest whose growth temperature becomes 950° C. or above is only the p-type GaN-based contact layer 9. This corresponds to the fact that the growth time of the p-type GaN-based contact layer 9 is made within 30 minutes. On the other hand, in the constitution of FIG. 3, the layer of interest whose growth temperature becomes 950° C. or above is the p-type AlGan cladding layer 12 and the p-type GaN-based contact layer 9. The total growth time of these two layers only has to be within 30 minutes.

Hence, in the constitution of FIG. 1, the layer of interest whose growth temperature becomes 950° C. or more is only the p-type Gan-based contact layer 9. This corresponds to the fact that the growth time of the p-type Gan-based contact layer 9 is made within 30 minutes. On the other hand, in the constitution of FIG. 3, the layer of interest whose growth temperature becomes 950° C. or more is the p-type AlGan cladding layer 12 and the p-type Gan-based contact layer 9. The total of the growth times of these two layers only has to be within 30 minutes.

However, the carrier compensation center can also be reduced as much as possible by heating the undoped InGaN layer 7 at a high temperature of 950° C. or above instead of the growth temperature of approximately 750° C. to remove the convexoconcave on the surface as much as possible. In this case, the film thickness of each layer must be adjusted now in order to make the total time when the growth temperature is 950° C. or above be within 30 minutes.

Incidentally, the manufacturing method described above uses a p-type GaN layer as the p-type Gan-based contact layer 9 in the constitution of FIG. 1. The growth temperature is increased to 1000 to 1030° C. (e.g., 1010° C.), and the film is grown to, for example, 700 Å. Nevertheless, particularly in a green LED or the like having a high In content, the InGaN well layer 6c is pyrolyzed even at this temperature. Therefore, in this case, the growth temperature of the p-type GaN-based contact layer 9 is suppressed to 800 to 900° C. Instead of making the growth temperature 800 to 900° C., a p-type InGaN layer doped with Mg that can exhibit a high hole carrier concentration at this growth temperature is used as the p-type GaN-based contact layer 9. The In composition ratio of the p-type InGaN layer is determined by the growth temperature, but is sufficient when approximately 0.5% to 3%. By reducing the total growth time when the growth temperature is 950° C. or above as much as possible as described above, the light emitting element can be used especially for a green LED with a high In content, or the like.

When a p-type InGaN contact layer is used in the constitution of FIG. 1, the total growth time when the growth temperature exceeds 950° C. can be made to be 0 from the completion of the formation of the well layer closest to the p-type nitride semiconductor layer among the well layers in the active layer 6 until the completion of the formation of the p-type GaN-based contact 8. This is effective means especially for a green LED with a high In content, or the like.

On the other hand, in the constitution of FIG. 3, the p-type AlGan cladding layer 12 is formed to have a thickness of 200 Å, for example. AlGaN is made to grow at a temperature of approximately 950° C., desirably approximately 1000° C. or above. At this time, the growth time at 950° C. or above is adjusted to be within 30 minutes by increasing the formation speed or decreasing the film thickness of the p-type GaN-based contact layer 8. If possible, 15 minutes or less is desirable.

The invention claimed is:

1. A nitride semiconductor light emitting element with a structure in which an active layer is sandwiched between a p-type nitride semiconductor layer and an n-type nitride semiconductor layer, the active layer having a quantum well structure with a well layer and a barrier layer made of a nitride containing In, the nitride semiconductor light emitting element wherein:

a first undoped InGaN layer and a second undoped InGaN layer with an In content different from that of the first undoped InGaN layer are formed between the p-type nitride semiconductor layer and the well layer of the active layer disposed at a position closest to the p-type side;

an In composition ratio of the first undoped InGaN layer is uniform throughout the entire thickness and smaller than an In composition ratio of the barrier layer; and a total film thickness of the first undoped InGaN layer and the second undoped InGaN layer is 20 nm or less.

2. The nitride semiconductor light emitting element according to claim 1, wherein
the first undoped InGaN layer is formed to contact the well layer of the active layer disposed at the position closest to the p-type side, and an In composition ratio of the second undoped InGaN layer disposed on the first undoped InGaN layer is smaller than the In composition ratio of the first undoped InGaN layer.

3. The nitride semiconductor light emitting element according to claim 2, wherein
the In composition ratio of the first undoped InGaN layer and the In composition ratio of the second undoped InGaN layer are both 2.5% or less.

4. The nitride semiconductor light emitting element according to claim 1, wherein
the second undoped InGaN layer is formed between the first undoped InGaN layer and the p-type nitride semiconductor layer, and
the second undoped InGaN layer is an In composition gradient layer whose In content decreases toward the p-type nitride semiconductor layer.

5. The nitride semiconductor light emitting element according to claim 4, wherein
an In gradient of the In composition gradient layer is formed during a process of increasing a temperature to a growth temperature for forming the p-type nitride semiconductor layer.

6. The nitride semiconductor light emitting element according to claim 1, wherein
a p-type contact layer is formed as a part of the p-type nitride semiconductor layer, and is in contact with a p-electrode and
the p-type contact layer is made up of any one of Mg-doped InGaN and Mg-doped GaN.

7. The nitride semiconductor light emitting element according to claim 6, wherein
the p-type nitride semiconductor layer is disposed on the second undoped InGaN layer, and
the p-type nitride semiconductor layer comprises an Mg-doped p-type $Al_xGaN$ ($0.02 \leq x \leq 0.15$) cladding layer and the p-type contact layer disposed on the p-type cladding layer.

8. The nitride semiconductor light emitting element according to claim 7, wherein
the p-type $Al_xGaN$ ($0.02 \leq x \leq 0.15$) cladding layer has a hole carrier concentration in a range of $2 \times 10^{17}$ $cm^{-3}$ or more.

9. The nitride semiconductor light emitting element according to claim 7, wherein
the p-type $Al_xGaN$ ($0.02 \leq x \leq 0.15$) is grown at a temperature of 1000° C. or above.

10. The nitride semiconductor light emitting element according to claim 1, wherein
an In composition ratio of the well layer is 10% or more, and
a total time when a growth temperature is 950° C. or above is within 30 minutes from the time of completion of the formation of the well layer of the active layer disposed at the position closest to the p-type side to the time of completion of the formation of the p-type nitride semiconductor layer.

11. The nitride semiconductor light emitting element according to claim 1, wherein
the p-type nitride semiconductor layer comprises a p-type contact layer disposed on the second undoped InGaN layer, and
the p-type contact layer is made up of any one of Mg-doped InGaN and Mg-doped GaN.

* * * * *